US012588525B2

(12) United States Patent
Hou et al.

(10) Patent No.: US 12,588,525 B2
(45) Date of Patent: Mar. 24, 2026

(54) PACKAGING SUBSTRATE INCLUDING AN UNDERFILL INJECTION OPENING AND METHODS OF FORMING THE SAME

(71) Applicant: Taiwan Semiconductor Manufacturing Company Limited, Hsinchu (TW)

(72) Inventors: Hao-Cheng Hou, Hsinchu City (TW); Tsung-Ding Wang, Tainan (TW); Jung Wei Cheng, Hsinchu City (TW); Yu-Min Liang, Zhongli City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 811 days.

(21) Appl. No.: 17/864,564

(22) Filed: Jul. 14, 2022

(65) Prior Publication Data

US 2023/0307345 A1     Sep. 28, 2023

Related U.S. Application Data

(60) Provisional application No. 63/322,856, filed on Mar. 23, 2022.

(51) Int. Cl.
H01L 23/498 (2006.01)
H01L 21/48 (2006.01)
(Continued)

(52) U.S. Cl.
CPC .... H01L 23/49838 (2013.01); H01L 21/4853 (2013.01); H01L 23/49816 (2013.01);
(Continued)

(58) Field of Classification Search
None
See application file for complete search history.

(56) References Cited

U.S. PATENT DOCUMENTS 10,790,162 B2 * 9/2020 Tsai .................... H01L 23/5389
11,164,754 B2 * 11/2021 Tsai ...................... H01L 25/105
(Continued)

FOREIGN PATENT DOCUMENTS

| TW | 202203410 | 1/2022 |
| TW | 202207399 | 2/2022 |

OTHER PUBLICATIONS

Taiwan Patent & Trademark Office, Jianq Chyun Intellectual Property Office, TW Application No. 112100983 Office Action mailed Oct. 3, 2023; 8 pages.

*Primary Examiner* — Long Pham
(74) *Attorney, Agent, or Firm* — The Marbury Law Group, PLLC

(57) ABSTRACT

An assembly including at least one semiconductor die and an interposer is provided. A packaging substrate including substrate bonding pads is provided. The packaging substrate includes a first horizontal surface facing the assembly, a second horizontal surface located on an opposite side of the first horizontal surface, and an opening extending between the first horizontal surface and the second horizontal surface. The assembly is attached to the packaging substrate by bonding first solder material portions bonded to a respective one of the substrate bonding pads and to a respective one of first interposer bonding pads located on the interposer.

20 Claims, 25 Drawing Sheets

(51) Int. Cl.
    *H01L 23/538*     (2006.01)
    *H01L 25/16*     (2023.01)
    *H01L 23/00*     (2006.01)

(52) U.S. Cl.
    CPC .... *H01L 23/49833* (2013.01); *H01L 23/5381*
        (2013.01); *H01L 23/5385* (2013.01); *H01L*
        *23/5386* (2013.01); *H01L 25/162* (2013.01);
        *H01L 24/16* (2013.01); *H01L 24/32* (2013.01);
        *H01L 24/73* (2013.01); *H01L 2224/16227*
        (2013.01); *H01L 2224/16238* (2013.01); *H01L*
        *2224/32225* (2013.01); *H01L 2224/73204*
        (2013.01); *H01L 2924/3511* (2013.01)

(56)           References Cited

U.S. PATENT DOCUMENTS

| | | | |
|---|---|---|---|
| 2019/0198437 A1 | 6/2019 | Kim et al. | |
| 2020/0105544 A1* | 4/2020 | Tsai | H01L 21/4853 |
| 2021/0257303 A1 | 8/2021 | Alur et al. | |
| 2021/0305133 A1* | 9/2021 | Karhade | H01L 23/5381 |
| 2022/0068782 A1 | 3/2022 | Cheah et al. | |

\* cited by examiner

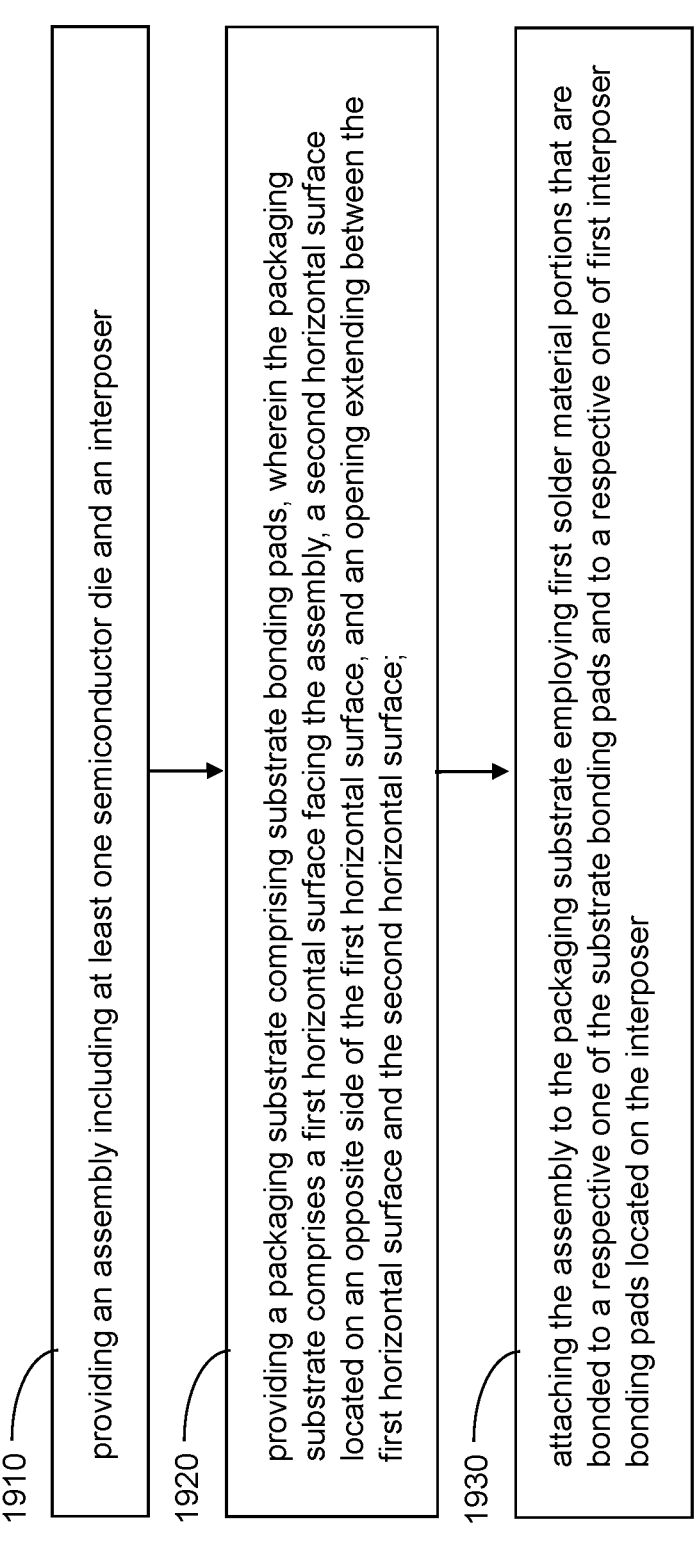

1910 — providing an assembly including at least one semiconductor die and an interposer 1920 — providing a packaging substrate comprising substrate bonding pads, wherein the packaging substrate comprises a first horizontal surface facing the assembly, a second horizontal surface located on an opposite side of the first horizontal surface, and an opening extending between the first horizontal surface and the second horizontal surface;

1930 — attaching the assembly to the packaging substrate employing first solder material portions that are bonded to a respective one of the substrate bonding pads and to a respective one of first interposer bonding pads located on the interposer

FIG. 19

PACKAGING SUBSTRATE INCLUDING AN UNDERFILL INJECTION OPENING AND METHODS OF FORMING THE SAME

RELATED APPLICATIONS

This application claims the benefit of priority from U.S. Provisional Application No. 63,322,856 entitled "CoWoS-LSC with novel substrate design" filed on Mar. 23, 2022, the entire contents of which are incorporated herein by reference for all purposes.

BACKGROUND

As the lateral dimensions of interposers increase with an increasing package size, the application of an underfill material between an interposer and a packaging substrate becomes more difficult because the underfill material needs to be pushed through at least half of the lateral dimensions of the interposer. A long underfill extrusion distance adversely impacts uniform distribution of the underfill material in the packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 is a flowchart illustrating steps for forming an exemplary structure according to an embodiment of the present disclosure.

DETAILED DESCRIPTION

Figure 1:
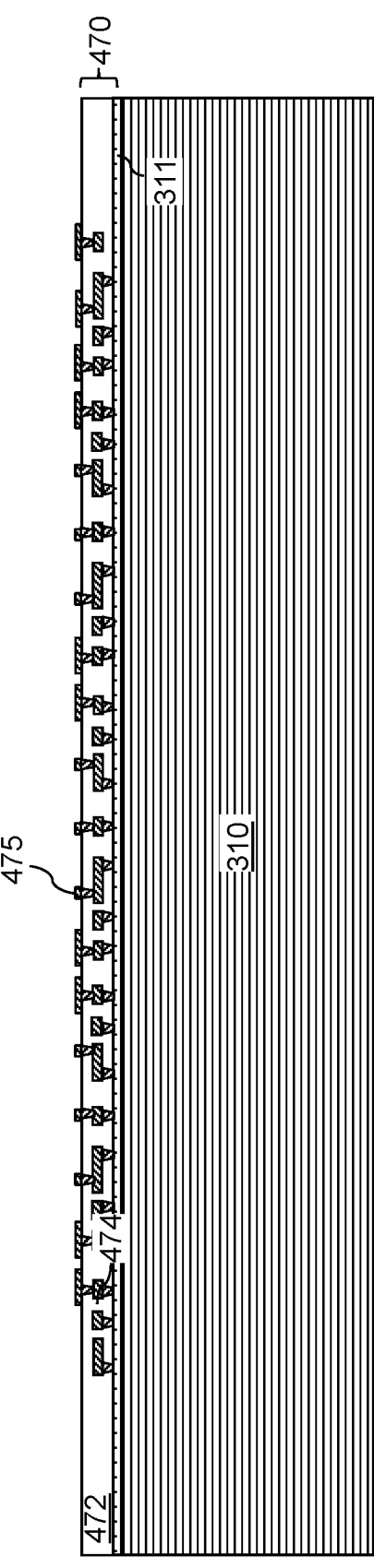
FIG. 1 is a vertical cross-sectional view of an exemplary structure after formation of die-side redistribution structures over a first carrier substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein may be directed to semiconductor devices, and particularly to uniform application of an underfill material in semiconductor die packaging. Generally, the various embodiment methods and structures disclosed herein may be used to provide a package structure including a fan-out package, a packaging substrate that is bonded to the fan-out package, with an underfill material portion applied into a gap between the fan-out package and the packaging substrate through an opening in the packaging substrate. Thus, the underfill material portion may be applied, at least partly, through the opening in the packaging substrate from a center region of an array of solder material portions used to bond the fan-out package and the packaging substrate. In case at least a surface mount die is present in the opening, the size of the opening through the packaging substrate may be large enough to accommodate at least one surface mount die therein. In embodiments in which a surface mount die is not present in the opening, the size of the opening may be of any size provided that an underfill material may be subsequently injected therethrough. In an embodiment, a surface mount die having a greater height than the spacing between the fan-out package and the packaging substrate may be mounted to the fan-out package within the area of the opening in the packaging substrate. Various aspects of embodiments of the present disclosure are now described with reference to accompanying figures.

Referring to FIG. 1, an exemplary structure according to an embodiment of the present disclosure is illustrated. The exemplary structure includes a first carrier wafer 310. The first carrier wafer 310 may include an optically transparent substrate such as a glass substrate or a sapphire substrate, or may comprise a semiconductor substrate such as a silicon substrate. The diameter of the first carrier wafer 310 may be in a range from 150 mm to 450 mm, although lesser and greater diameters may be used. The thickness of the first carrier wafer 310 may be in a range from 500 microns to 2,000 microns, although lesser and greater thicknesses may also be used. Alternatively, the first carrier wafer 310 may be provided in a rectangular panel format. A first adhesive layer 311 may be applied to a front-side surface of the first carrier wafer 310. In one embodiment, the first adhesive layer 311 may be a light-to-heat conversion (LTHC) layer. Alternatively, the first adhesive layer 311 may include a thermally decomposing adhesive material.

A two-dimensional array of die-side redistribution structures 470 may be formed over the first carrier substrate 310. Specifically, a die-side redistribution structure 470 may be formed within each unit area of repetition, which corresponds to the area of an interposer to be individually diced. Semiconductor dies are subsequently attached to the die-side redistribution structures 470, and thus, the redistribution structures formed at this processing step are referred to as die-side redistribution structures 470. While FIG. 1 illustrates a region within a unit area, repetition of the structure illustrated in FIG. 1 in two horizontal directions during manufacturing is understood.

Each die-side redistribution structure 470 may include die-side redistribution dielectric layers 472, die-side redistribution wiring interconnects 474, and microbump structures 475 (i.e., bump structures to be employed to contact local silicon interconnect bridges from the die side). The die-side redistribution dielectric layers 472 include a respective dielectric polymer material such as polyimide (PI), benzocyclobutene (BCB), or polybenzobisoxazole (PBO). Each die-side redistribution dielectric layer 472 may be formed by spin coating and drying of the respective dielectric polymer material. The thickness of each die-side redistribution dielectric layer 472 may be in a range from 2 microns to 40 microns, such as from 4 microns to 20 microns. Each die-side redistribution dielectric layer 472 may be patterned, for example, by applying and patterning a respective photoresist layer thereabove, and by transferring the pattern in the photoresist layer into the die-side redistribution dielectric layer 472 using an etch process such as an anisotropic etch process. The photoresist layer may be subsequently removed, for example, by ashing.

Each of the die-side redistribution wiring interconnects 474 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the die-side redistribution wiring interconnects 474 may include copper, nickel, or copper and nickel. The thickness of the metallic fill material that is deposited for each die-side redistribution wiring interconnect 474 may be in a range from 2 microns to 40 microns, such as from 4 microns to 10 microns, although lesser or greater thicknesses may also be used. The total number of levels of wiring in each die-side redistribution structure 470 (i.e., the levels of the die-side redistribution wiring interconnects 474) may be in a range from 1 to 10.

The microbump structures 475 are bump structures that are subsequently used to electrically connect local silicon interconnect bridges to be subsequently bonded to a respective one of the die-side redistribution structures 470. The metallic fill material for the microbump structures 475 may include copper. The microbump structures 475 may have horizontal cross-sectional shapes of rectangles, rounded rectangles, or circles. Other horizontal cross-sectional shapes may be within the contemplated scope of disclosure. Typically, the microbump structures 475 may be configured for microbump bonding, and may have a thickness in a range from 5 microns to 100 microns, although lesser or greater thicknesses may also be used. In one embodiment, the microbump structures 475 may be formed as an array of microbumps (such as copper pillars) having a lateral dimension in a range from 10 microns to 50 microns, and having a pitch in a range from 20 microns to 100 microns.

Figure 2:
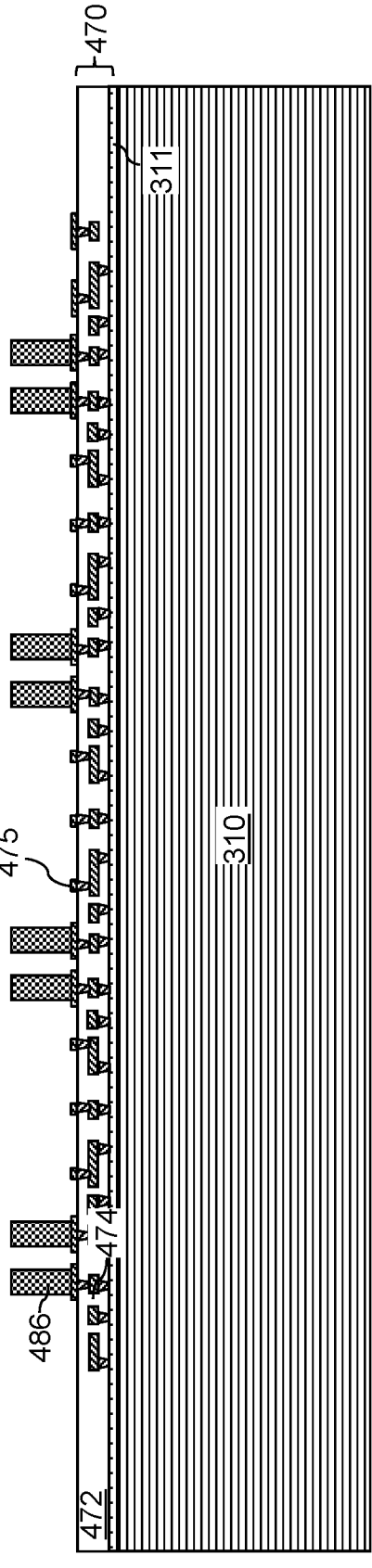
FIG. 2 is a vertical cross-sectional view of the exemplary structure after formation of through-integrated-fan-out-via structures (TIV structures) according to an embodiment of the present disclosure.

Referring to FIG. 2, a sacrificial matrix material layer (not shown) may be applied over the die-side redistribution structures 470, and cylindrical cavities may be formed through the sacrificial matrix material layer. The sacrificial matrix material layer may comprise a polymer material such as polyimide. The pattern of the cylindrical cavities may be arranged around regions in which the local silicon interconnect (LSI) bridges are to be subsequently placed. As such, the cylindrical cavities are formed around regions including a respective array of microbump structures 475. Generally, the pattern of the cylindrical cavities may be a periodic pattern that is arranged as a two-dimensional periodic array such as a rectangular array. Each unit pattern within the periodic pattern may have the same area as the area of an interposer to be manufactured. In other words, a two-dimensional array of interposers may be formed by performing subsequent processing patterns. As such, a unit area that corresponds to the area of a single interposer includes a unit pattern for the cylindrical cavities.

At least one conductive material such as at least one metallic material (such as W, Mo, Ta, Ti, WN, TaN, TiN, etc.) may be deposited in the cylindrical cavities, and excess portions of the at least one conductive material may be removed from above the horizontal plane including the top surface of the sacrificial matrix material layer. Remaining portions of the at least one conductive material comprise through-integrated-fan-out-via structures 486, which are also referred to through-InFO-via structures 486 or TIV structures 486. The sacrificial matrix material layer may be subsequently removed, for example, by dissolving in a solvent or by ashing. A plurality of local silicon interconnect bridges (LSI bridges) may be subsequently boned to the die-side redistribution structures 470.

Figure 3:
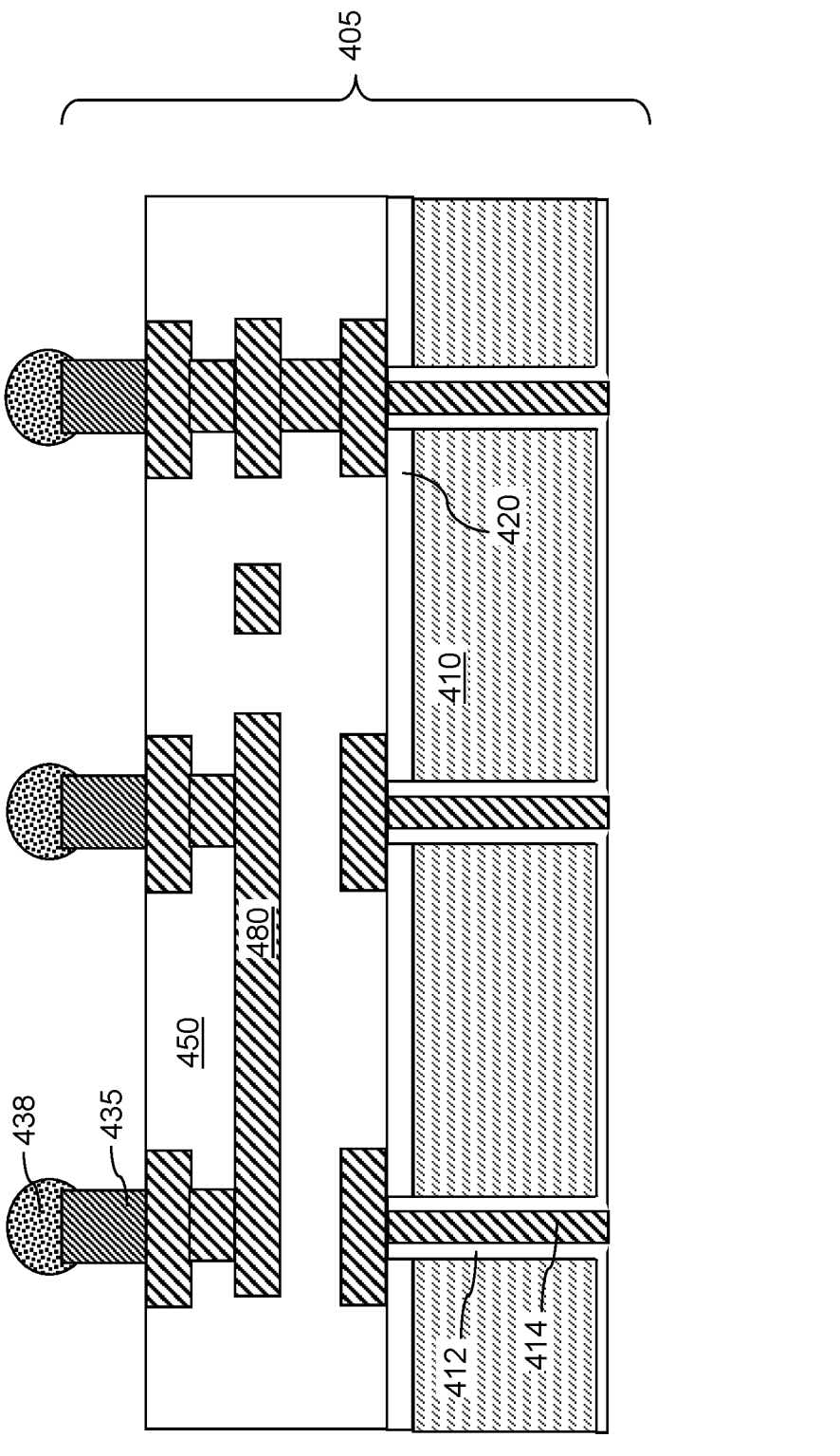
FIG. 3 is a vertical cross-sectional view of an exemplary local silicon interconnect (LSI) bridge that may be subsequently integrated into the exemplary structure.

Referring to FIG. 3, an example of a local silicon interconnect bridge (LSI bridge) 405 is illustrated. The LSI bridge 405 includes a silicon substrate 410 (as thinned and diced during manufacturing of the local silicon interconnect bridge 405), through-substrate openings that vertically extend through the silicon substrate 410, a dielectric liner 412 that provides electrical isolation for through-silicon via structures 414, backside dielectric material layer 420, and metal interconnect structures 480 embedded in dielectric material layers 450 and electrically connected to the through-silicon via structures 414 and/or electrically connected thereamongst. LSI microbump structures 435 configurated for microbump connection may be provided on the topmost metal interconnect structures 480. Optionally, a subset of the metal interconnect structures 480 may provide electrical connection among between a subset of the LSI microbump structures 435. Solder material portions 438 may be applied to the LSI microbump structures 435 in preparation for a subsequent bonding process.

Figure 4:
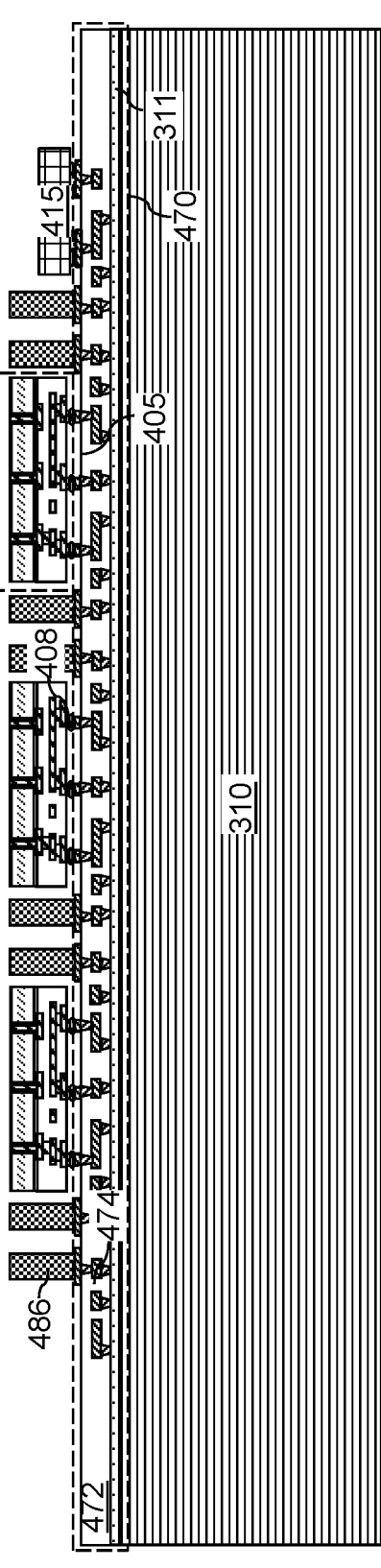
FIG. 4 is a vertical cross-sectional view of the exemplary structure after attaching LSI bridges to the die-side redistribution structures according to an embodiment of the present disclosure.

Referring to FIG. 4, the local silicon interconnect bridges (LSI bridges) 405 may be placed in vacant areas that are not occupied by the through-integrated-fan-out-via structures 486. Generally, any type of LSI bridges 405 known in the art may be used. The microbump structures 435 on the LSI bridges 405 may be bonded to the microbump structures 475 on the die-side redistribution structures 470 using arrays of solder material portions 438 (shown in FIG. 3). Each bonded combination of a microbump structure 435 on an LSI bridge

405, a microbump structure 475 on a die-side redistribution structure 470, and a solder material portion is herein referred to as a microbump bonding structure 408. Generally, the LSI bridges 405 are bonded to the die-side redistribution structures 470 employing arrays of microbump bonding structures 408. Optionally, underfill material portions (not illustrated) may be applied around each array of microbump bonding structures 408.

In some embodiments, at least one semiconductor die 415, such as an integrated passive device die or a surface mount die, may be bonded to each of the die-side redistribution structures 470.

Figure 5:
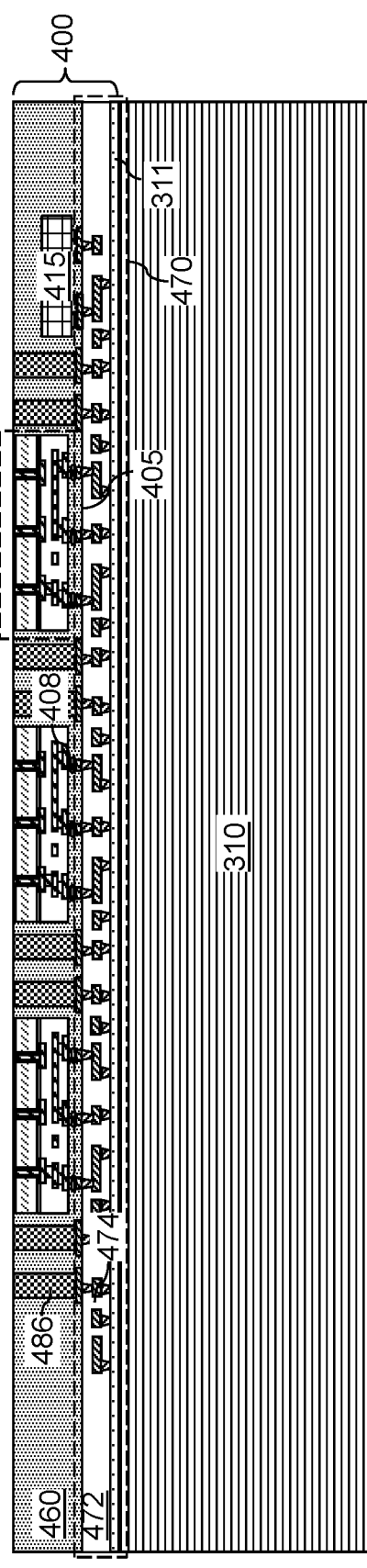
FIG. 5 is a vertical cross-sectional view of the exemplary structure after formation of molding compound interposer frames according to an embodiment of the present disclosure.

Referring to FIG. 5, an encapsulant, such as a molding compound (MC) may be applied to the gaps between the bridge dies 405 and the TIV structures 486. The MC includes an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC typically provides better handling, good flowability, less voids, better fill, and less flow marks. Solid MC typically provides less cure shrinkage, better stand-off, and less die drift. A high filler content (such as 85% in weight) within an MC may shorten the time in mold, lower the mold shrinkage, and reduce the mold warpage. Uniform filler size distribution in the MC may reduce flow marks, and may enhance flowability.

The MC may be cured at a curing temperature to form an MC matrix, which is herein referred to as a first MC matrix or an interposer-level MC matrix. In case underfill material portions are employed to laterally surround the array of microbump bonding structures 408, such underfill material portions may be incorporated into the first MC matrix. The first MC matrix laterally encloses each of the bridge dies 405 and the TIV structures 486. The first MC matrix may be a continuous material layer that extends across the entirety of the area of the reconstituted wafer overlying the first carrier wafer 310. As such, the first MC matrix may include a plurality of molding compound (MC) interposer frames 460 that are laterally adjoined to one another. Each MC interposer frame 460 corresponds to a portion of the first MC matrix located within a unit area, i.e., an area of a single interposer to be subsequently formed. Each MC interposer frame 460 may be located within a respective unit area, and laterally surrounds a respective set of at least one bridge die 405 and a respective array of TIV structures 486. Excess portions of the first MC matrix may be removed from above the horizontal plane including the top surfaces of the bridge die 405 and the TIV structures 486 by a planarization process, which may use chemical mechanical planarization (CMP). Surfaces of the through-silicon via structures 414 may be physically exposed after the planarization process.

A reconstituted wafer is formed over the first carrier wafer 310. Each portion of the reconstituted wafer located within a unit area constitutes an interposer, which is herein referred to as a local-silicon-interconnect-containing interposer 400, or an LSI-containing interposer 400. Each LSI-containing interposer 400 comprises a set of at least one LSI bridge 405, a set of TIV structures 486, an MC interposer frame 460 (which is a portion of the first MC matrix), and a die-side redistribution structure 470.

Figure 6:
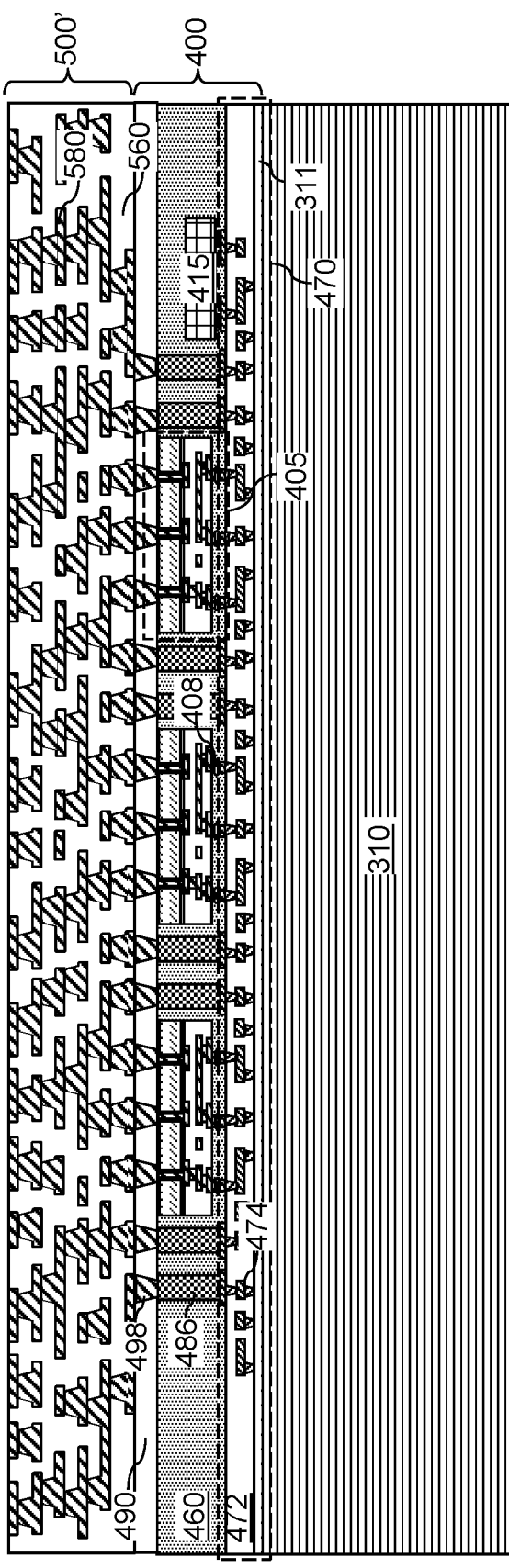
FIG. 6 is vertical cross-sectional view of the exemplary structure after attaching additional redistribution structures according to an embodiment of the present disclosure.

Referring to FIG. 6, an in-process package-side redistribution structure 500' may be formed on the two-dimensional array of LSI-containing interposers 400. As used herein, an "in-process" element refers to an element that is modified in a subsequent processing step, for example, by patterning, by change of material composition, and/or by addition or subtraction of a material portion. In embodiments in which the in-process package-side redistribution structure 500', additional structures may be added in subsequent processing steps.

A two-dimensional array of in-process package-side redistribution structures 500' may be transferred from another reconstituted wafer, and may be bonded to the two-dimensional array of LSI-containing interposers 400. For example, a dielectric material layer 490 may be formed over the MC interposer frame 460 by deposition of a dielectric material, which may comprise a polymer material. The polymer material of the dielectric material layer 490 may comprise any material that may be used for the die-side redistribution dielectric layers 472. In one embodiment, the dielectric material layer 490 may comprise a filler material therein to provide increased mechanical strength during a subsequent bonding process. Via cavities may be formed through the dielectric material layer 490, and may be filled with a metallic bonding material such as copper to form metal via structures 498, which function as metallic bonding structures in subsequent processing steps. The dielectric material layer 490 and the metal via structures 498 are incorporated into the LSI-containing interposers 400. Each in-process package-side redistribution structures 500' may comprise an array of metallic bonding structures such as an array of copper bonding pads. The array of metallic bonding structures on each in-process package-side redistribution structure 500' may be arranged as a mirror image pattern of the pattern of the array of metal via structures 498 within a respective LSI-containing interposer 400. The array of the LSI-containing interposers 400 and the array of in-process package-side redistribution structures 500' may be subsequently boned to each other by inducing metal-to-metal bonding between the metal via structures 498 and metallic bonding structures within the in-process package-side redistribution structures 500'.

An in-process package-side redistribution structure 500' may be formed within each unit area, which is the area a repetition unit that may be repeated in a two-dimensional array as discussed above. The in-process package-side redistribution structure 500' may include first package-side redistribution dielectric layers 560 and first package-side redistribution wiring interconnects 580. The first package-side redistribution dielectric layers 560 may include any dielectric material that may be used for the die-side redistribution dielectric layers 472. The first package-side redistribution wiring interconnects 580 may include any material that may be used for the die-side redistribution wiring interconnects 474.

In an alternative embodiment, the in-process package-side redistribution structure 500' may be formed by repetition of a sequence of processing steps that includes a dielectric deposition step that deposits a package-side redistribution dielectric layer, a patterning step that forms openings through the package-side redistribution dielectric layer, a metal deposition step that deposits a metallic material layer (such as a copper layer), and a patterning step that patterns the metallic material layer into a respective subset of the first package-side redistribution wiring interconnects 580 formed at a respective level. In this embodiment, the set of processing steps used to form the die-side redistribution dielectric layers 472 and the die-side redistribution wiring interconnects 474 may be used mutatis mutandis, for example, with suitable changes in the pattern of material portions, material compositions, and/or material thicknesses.

Figure 7:
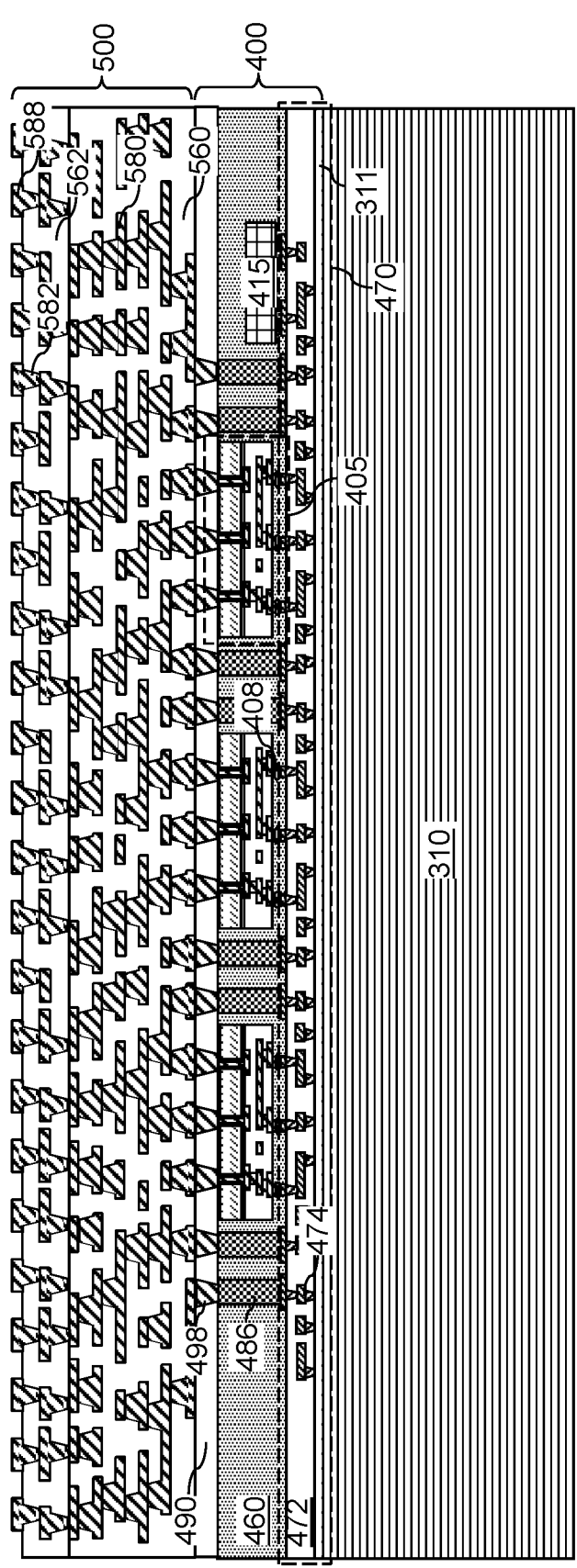
FIG. 7 is vertical cross-sectional view of the exemplary structure after formation of a composite interposer including a stack of an LSI-containing interposer and an organic interposer according to an embodiment of the present disclosure.

Referring to FIG. 7, at least one additional package-side redistribution dielectric layer (which is herein referred to as at least one second package-side redistribution dielectric layer 562) and additional package-side redistribution wiring interconnects (which are herein referred to as second package-side redistribution wiring interconnects 582) may be formed over the in-process package-side redistribution structure 500'. The at least one second package-side redistribution dielectric layer 562 and the second package-side redistribution wiring interconnects 582 may be formed by performing a sequence of processing steps at least once. The sequence of processing steps includes a dielectric deposition step that deposits a package-side redistribution dielectric layer, a patterning step that forms openings through the package-side redistribution dielectric layer, a metal deposition step that deposits a metallic material layer (such as a copper layer), and a patterning step that patterns the metallic material layer into a respective subset of the first package-side redistribution wiring interconnects 580 formed at a respective level.

The first package-side redistribution dielectric layer 560 and the at least one second package-side redistribution dielectric layer 562 are collectively referred to as package-side redistribution dielectric layers (560, 562). The first package-side redistribution wiring interconnects 580 and the second package-side redistribution wiring interconnects 582 are collectively referred to as package-side redistribution wiring interconnects (580, 582). Interposer-side bonding pads 588 may be formed at the topmost level of the package-side redistribution dielectric layers (560, 562). In one embodiment, the interposer bonding pads 588 may be formed as a two-dimensional array of interposer bonding pads 588, which may be a periodic array such as a rectangular array or a hexagonal array. Generally, the pitches of the two-dimensional array of interposer bonding pads 588 along horizontal directions may be in a range from 100 microns to 800 microns, although lesser and greater pitches may also be used. For example, the pitches of the two-dimensional array of interposer bonding pads 588 may be in a range from 200 microns to 700 microns, although lesser and greater pitches may also be used.

The reconstituted wafer after the processing steps of FIG. 6 comprises the package-side redistribution dielectric layers (560, 562), the package-side redistribution wiring interconnects (580, 582), the interposer bonding pads 588, and a two-dimensional array of LSI-containing interposers 400. Each LSI-containing interposer 400 is located within a respective unit area, which is the area of a unit of repetition within the reconstituted wafer. Each portion of the set of materials including the package-side redistribution dielectric layers (560, 562), the package-side redistribution wiring interconnects (580, 582), and the interposer bonding pads 588 located within a unit area constitutes an organic interposer 500. Each contiguous vertical stack of an LSI-containing interposer 400 and an organic interposer 500 constitutes a composite interposer (400, 500). Thus, the reconstituted wafer may include a two-dimensional array of composite interposers (400, 500).

Figure 8:
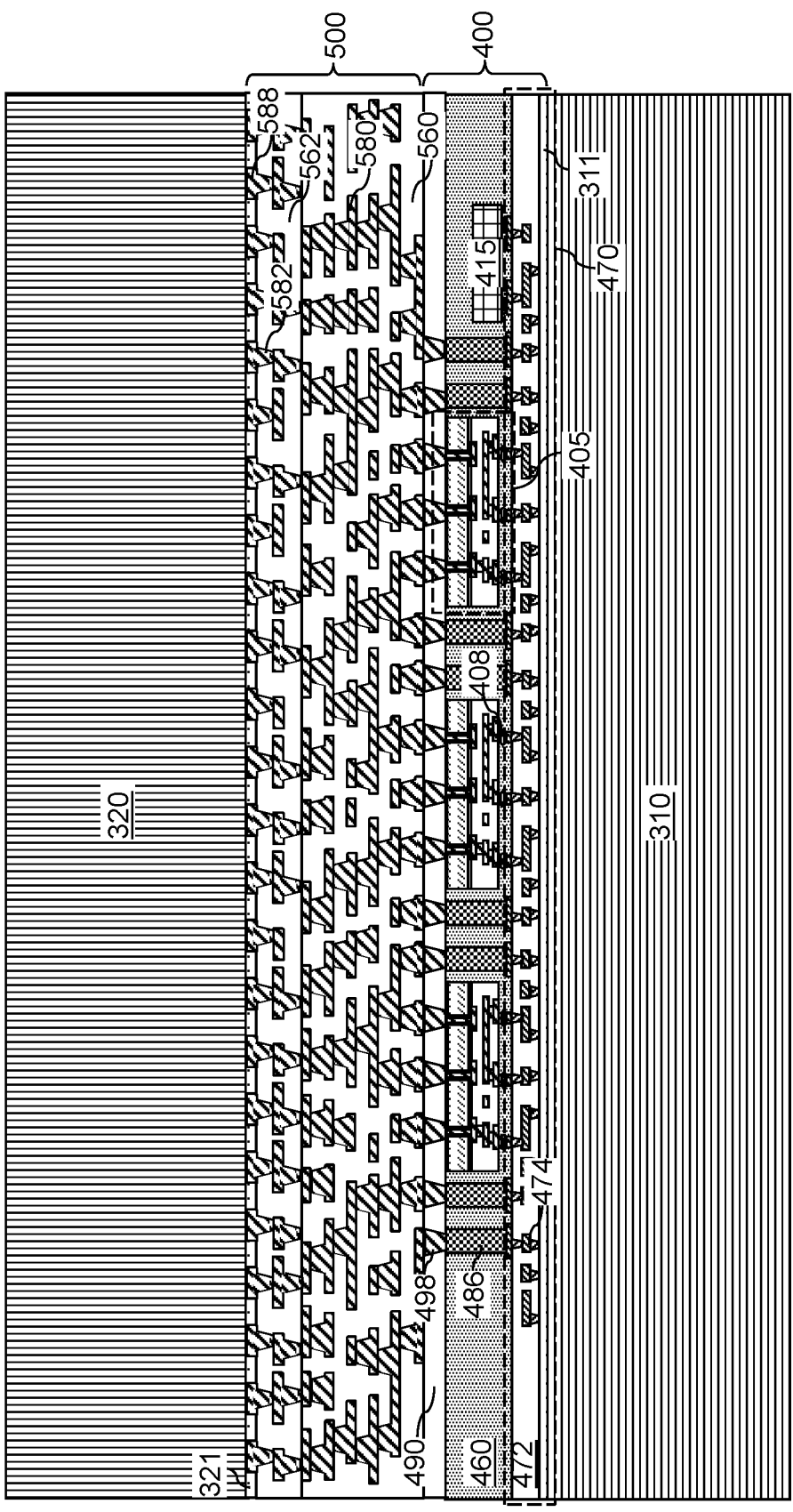
FIG. 8 is a vertical cross-sectional view of the exemplary structure after attachment of a second carrier wafer to the composite interposer according to an embodiment of the present disclosure.

Referring to FIG. 8, a second adhesive layer 321 may be applied over the package-side redistribution dielectric layers (560, 562). The second adhesive layer 321 may comprise a light-to-heat conversion (LTHC) layer or a thermally decomposing adhesive material layer depending on the removal mechanism to be subsequently used. A second carrier wafer 320 may be attached to the die-side redistribution structure 470 through the second adhesive layer 321. The second carrier wafer 320 may comprise any material that may be used for the first carrier wafer 310, and generally may have about the same thickness range as the first carrier wafer 310.

Figure 9:
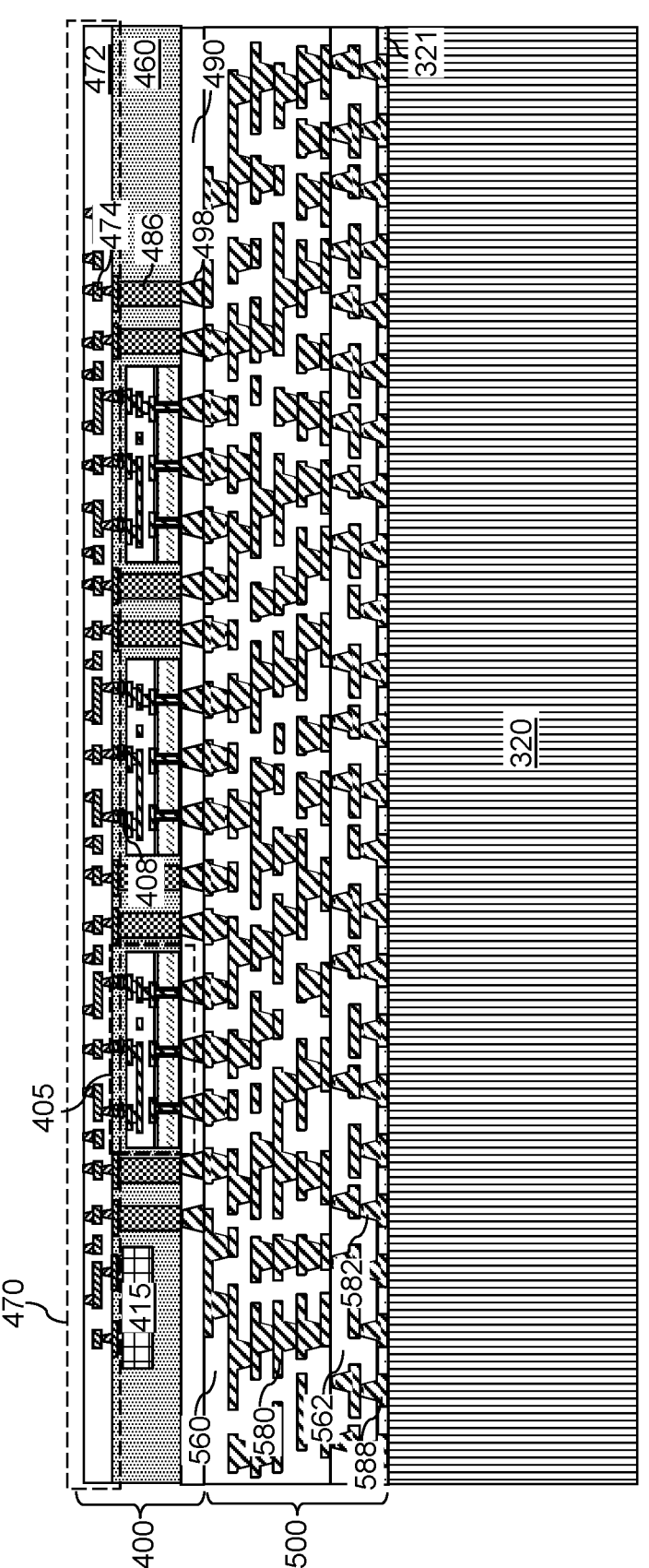
FIG. 9 is a vertical cross-sectional view of the exemplary structure after detaching the first carrier wafer according to an embodiment of the present disclosure.

Referring to FIG. 9, the first carrier wafer 310 may be detached from the reconstituted wafer. In some embodiments, the first carrier wafer 310 and the first adhesive layer 311 may be removed by backside grinding. Optionally, at least one selective etch process (such as a wet etch process or a reactive ion etch process) may be employed in conjunction with the backside grinding process to minimize collateral removal of surface portions of the composite interposers (400, 500). Alternatively or additionally, in embodiments in which the first carrier wafer 310 includes an optically transparent material and the first adhesive layer 311 comprises a light-to-heat conversion material, irradiation through the first carrier wafer 310 may be used to detach the first carrier wafer 310. In embodiments in which the first adhesive layer 311 comprises a thermally decomposable adhesive material, an anneal process or a laser irradiation may be used to detach the first carrier wafer 310. A suitable clean process may be performed to remove residual portions of the first adhesive layer 311.

On-interposer bump structures 478 may be formed on the top surface of the composite interposers (400, 500). The on-interposer bump structures 478 are bump structures that are subsequently employed to attach semiconductor dies. The metallic fill material for the on-interposer bump structures 478 may include copper. The on-interposer bump structures 478 may have horizontal cross-sectional shapes of rectangles, rounded rectangles, or circles. Other horizontal cross-sectional shapes may be within the contemplated scope of disclosure. Typically, the on-interposer bump structures 478 may be configured for microbump bonding, and may have a thickness in a range from 10 microns to 100 microns, although lesser or greater thicknesses may also be used. In such an embodiment, the on-interposer bump structures 478 may be formed as an array of microbumps (such as copper pillars) having a lateral dimension in a range from 10 microns to 50 microns, and having a pitch in a range from 20 microns to 100 microns. Generally, the pitches of the on-interposer bump structures 478 may be smaller than the pitches of the two-dimensional array of interposer bonding pads 588 by a factor in a range from 1 to 40, such as from 5 to 35.

Figure 10:
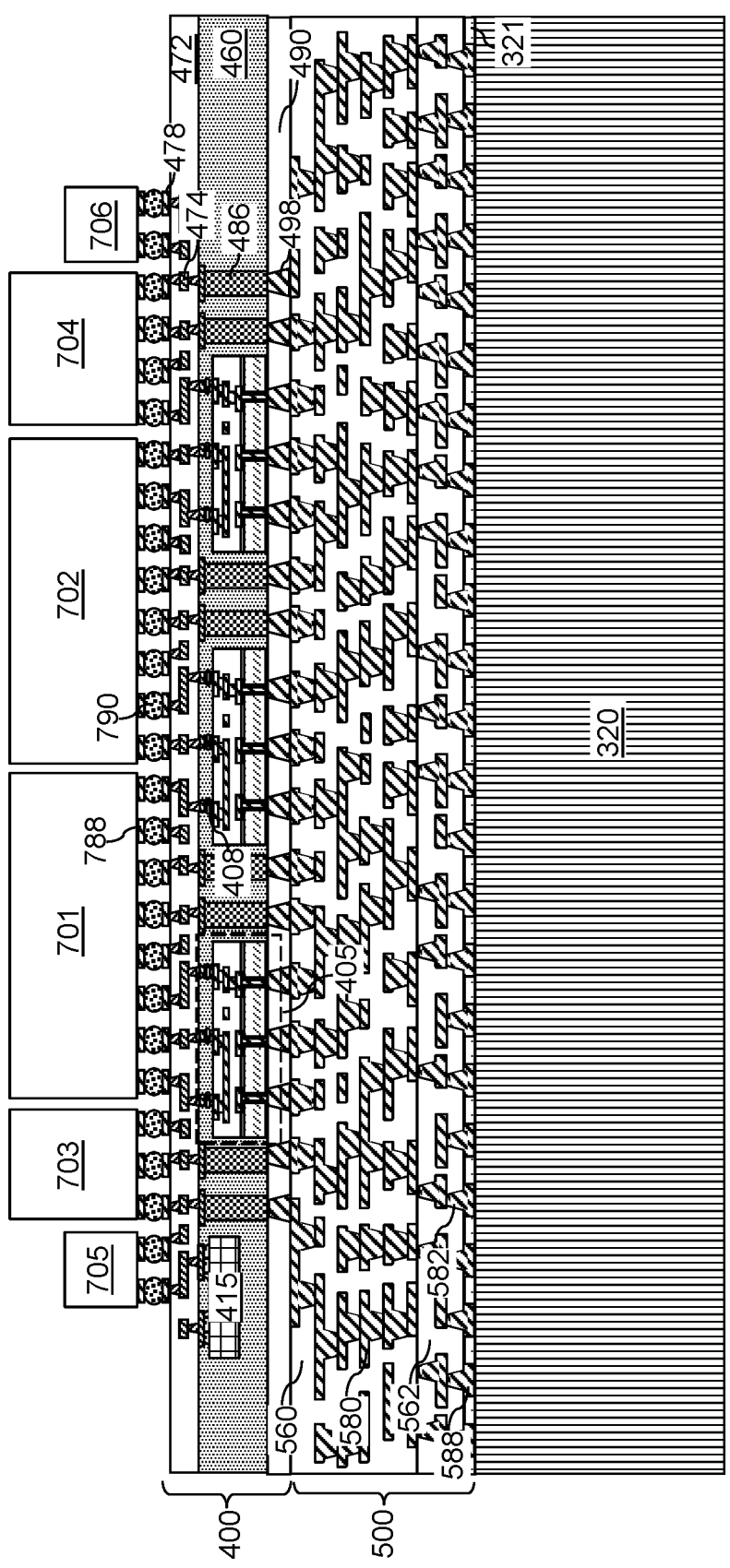
FIG. 10 is a vertical cross-sectional view of the exemplary structure after attaching semiconductor dies to the composite interposer according to an embodiment of the present disclosure.

Referring to FIG. 10, a set of at least one semiconductor die (701, 702, 703, 704, 705, 706) may be bonded to each composite interposer (400, 500). In one embodiment, the composite interposers (400, 500) may be arranged as a two-dimensional periodic array within the reconstituted wafer in the exemplary structure, and multiple sets of at least one semiconductor die (701, 702, 703, 704, 705, 706) may be bonded to the composite interposers (400, 500) as a two-dimensional periodic rectangular array of sets of the at least one semiconductor die (701, 702, 703, 704, 705, 706). Each set of at least one semiconductor die (701, 702, 703, 704, 705, 706) includes at least one semiconductor die. Each set of at least one semiconductor die (701, 702, 703, 704, 705, 706) may include any set of at least one semiconductor die known in the art. In one embodiment, each set of at least one semiconductor die (701, 702, 703, 704, 705, 706) may comprise a plurality of semiconductor dies (701, 702, 703, 704, 705, 706). For example, each set of at least one semiconductor die (701, 702, 703, 704, 705, 706) may include at least one system-on-chip (SoC) die (701, 702) and/or at least one memory die (703, 704). Optionally, each set of at least one semiconductor die (701, 702, 703, 704, 705, 706) may include at least one surface mount die (705,

706) known in the art. Each SoC die (701, 702) may comprise an application processor die, a central processing unit die, or a graphic processing unit die. In one embodiment, the at least one memory die (703, 704) may comprise a high bandwidth memory (HBM) die that includes a vertical stack of static random access memory dies. In one embodiment, the at least one semiconductor die (701, 702, 703, 704, 705, 706) may include at least one system-on-chip (SoC) die (701, 702) and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die (701, 702, 703, 704, 705, 706) may comprise a respective array of on-die bump structures 788. Solder material portions may be applied to the on-die bump structures 788 of the semiconductor dies (701, 702, 703, 704, 705, 706), or may be applied to the on-interposer bump structures 478. The solder material portions are herein referred to as die-interposer-bonding (DIB) solder material portions 790, or as first solder material portions. Each of the semiconductor dies (701, 702, 703, 704, 705, 706) may be positioned in a face-down position such that on-die bump structures 788 face the on-interposer bump structures 478. Placement of the semiconductor dies (701, 702, 703, 704, 705, 706) may be performed using a pick and place apparatus such that each of the on-die bump structures 788 may face a respective one of the on-interposer bump structures 478. Each set of at least one semiconductor die (701, 702, 703, 704, 705, 706) may be placed within a respective unit area. A DIB solder material portion 790 is attached to one of the on-die bump structure 788 and the on-interposer bump structure 478 for each facing pair of an on-die bump structure 788 and an on-interposer bump structure 478.

Generally, a composite interposer (400, 500) may be provided, which includes interposer bump structure 478 thereupon. At least one semiconductor die (701, 702, 703, 704, 705, 706) may be provided, each of which includes a respective set of on-die bump structures 788. The at least one semiconductor die (701, 702, 703, 704, 705, 706) may be bonded to the composite interposer (400, 500) using the DIB solder material portions 790 that are bonded to a respective on-interposer bump structure 478 and to a respective on-die bump structure 788. Each set of at least one semiconductor die (701, 702, 703, 704, 705, 706) may be attached to a respective composite interposer (400, 500) through a respective set of DIB solder material portions 790.

In one embodiment, the on-die bump structures 788 and the on-interposer bump structures 478 may be configured for microbump bonding. In this embodiment, each of the on-die bump structures 788 and the on-interposer bump structures 478 may be configured as copper pillar structures having a diameter in a range from 10 microns to 50 microns, and may have a respective height in a range from 5 microns to 100 microns. The pitch of the microbumps in the direction of periodicity may be in a range from 20 microns to 100 microns, although lesser and greater pitches may also be used. Upon reflow, the lateral dimensions of each DIB solder material portion 790 may be in a range from 100% to 150% of the lateral dimension (such as a diameter) of the adjoined on-die bump structure 788 or of the adjoined on-interposer bump structure 478.

Figure 11:
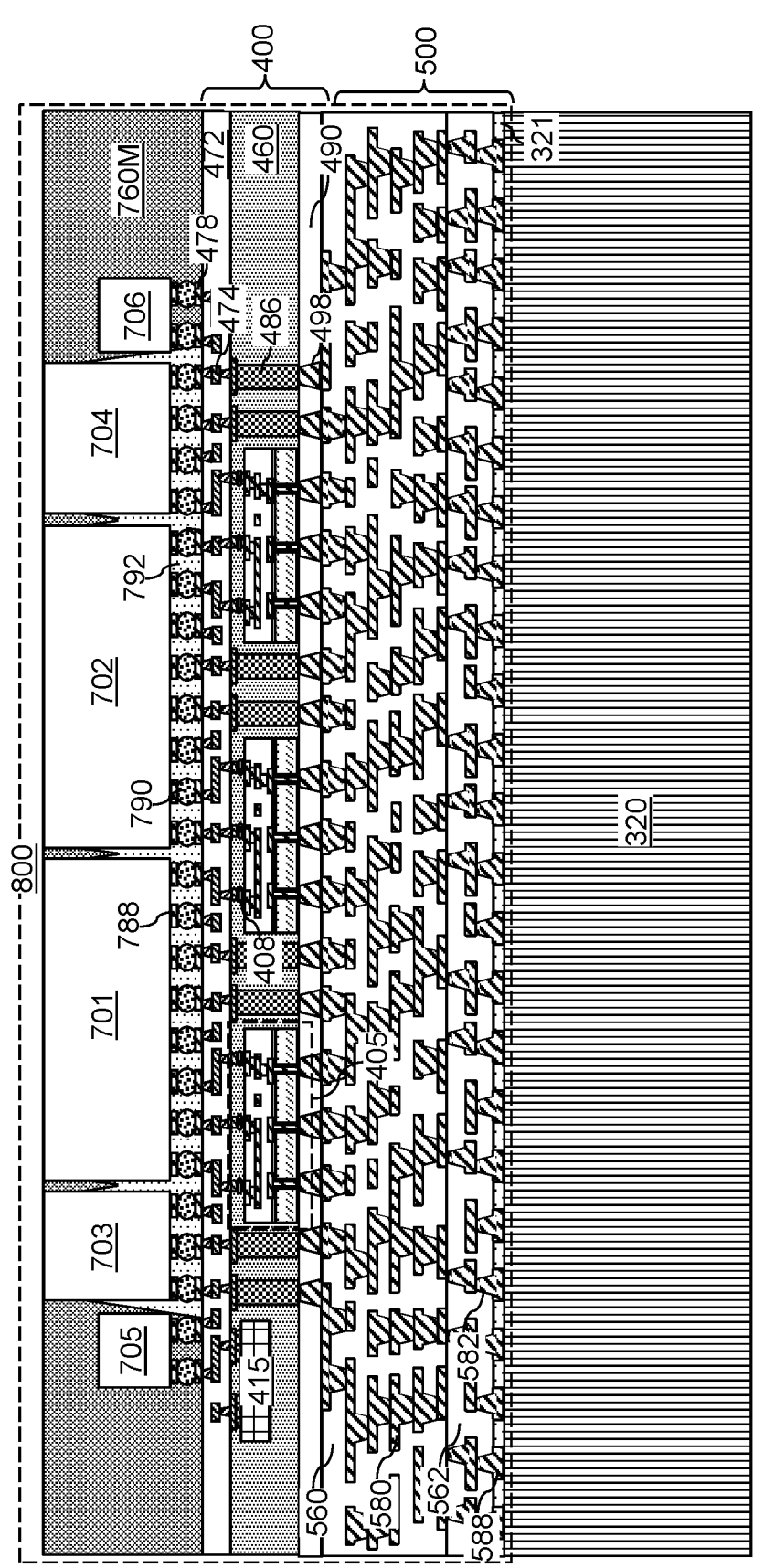
FIG. 11 is a vertical cross-sectional view of the exemplary structure after formation of a molding compound layer according to an embodiment of the present disclosure.

Referring to FIG. 11, a die-side underfill material may be applied into each gap between the composite interposers (400, 500) and sets of at least one semiconductor die (701, 702, 703, 704, 705, 706) that are bonded to the composite interposers (400, 500). The die-side underfill material may comprise any underfill material known in the art. A die-side underfill material portion 792 may be formed within each unit area between a composite interposer (400, 500) and an overlying set of at least one semiconductor die (701, 702, 703, 704, 705, 706). The die-side underfill material portions 792 may be formed by injecting the die-side underfill material around a respective array of DIB solder material portions 790 in a respective unit area. Any known underfill material application method may be used, which may be, for example, the capillary underfill method, the molded underfill method, or the printed underfill method.

Within each unit area, a die-side underfill material portion 792 may laterally surround, and contact, a respective set of the DIB solder material portions 790 within the unit area. The die-side underfill material portion 792 may be formed around, and contact, the DIB solder material portions 790, the on-interposer bump structures 478, and the on-die bump structures 788 in the unit area. Generally, at least one semiconductor die (701, 702, 703, 704, 705, 706) comprising a respective set of on-die bump structures 788 is attached to the on-interposer bump structures 478 through a respective set of DIB solder material portions 790 within each unit area. Within each unit area, a die-side underfill material portion 792 laterally surrounds the on-interposer bump structures 478 and the on-die bump structures 788 of the at least one semiconductor die (701, 702, 703, 704, 705, 706).

A molding compound (MC) may be applied to the gaps between assemblies of a respective set of semiconductor dies (701, 702, 703, 704, 705, 706) and a respective die-side underfill material portion 792. The MC may include any material that may be used for the MC interposer frames 460 discussed above. The MC may include epoxy resin, hardener, silica (as a filler material), and other additives. The MC may be cured at a curing temperature to form an MC matrix, which is herein referred to as a die-level MC matrix 760M or as a second MC matrix. The die-level MC matrix 760M laterally surrounds and embeds each assembly of a set of semiconductor dies (701, 702, 703, 704, 705, 706) and a die-side underfill material portion 792. The die-level MC matrix 760M includes a plurality of molding compound (MC) die frames that may be laterally adjoined to one another. Each MC die frame is a portion of the die-level MC matrix 760M that is located within a respective unit area. Thus, each MC die frame laterally surrounds, and embeds, a respective a set of semiconductor dies (701, 702, 703, 704, 705, 706) and a respective die-side underfill material portion 792. Young's modulus of pure epoxy is about 3.35 GPa, and Young's modulus of the MC may be higher than Young's modulus of pure epoxy due to additives therein. Thus, Young's modulus of the die-level MC matrix 760M may be greater than 3.5 GPa.

Portions of the die-level MC matrix 760M that overlies the horizontal plane including the top surfaces of the semiconductor dies (701, 702, 703, 704, 705, 706) may be removed by a planarization process. For example, the portions of the die-level MC matrix 760M that overlies the horizontal plane may be removed using a chemical mechanical planarization (CMP). The reconstituted wafer that overlies the second carrier wafer 320 comprises a combination of the die-level MC matrix 760M, the semiconductor dies (701, 702, 703, 704, 705, 706), the die-side underfill material portions 792, and the two-dimensional array of composite interposers (400, 500). Each portion of the die-level MC matrix 760M located within a unit area constitutes an MC die frame.

Each portion of the reconstituted wafer located within a unit area constitutes a fan-out package 800. Each fan-out package 800 may comprise at least one semiconductor die (701, 702, 703, 704, 705, 706), a composite interposer (400, 500), DIB solder material portions 790, at least one die-side underfill material portion 792, and an MC die frame that is a portion of the die-level MC matrix 760M located within a respective unit area.

Figure 12:
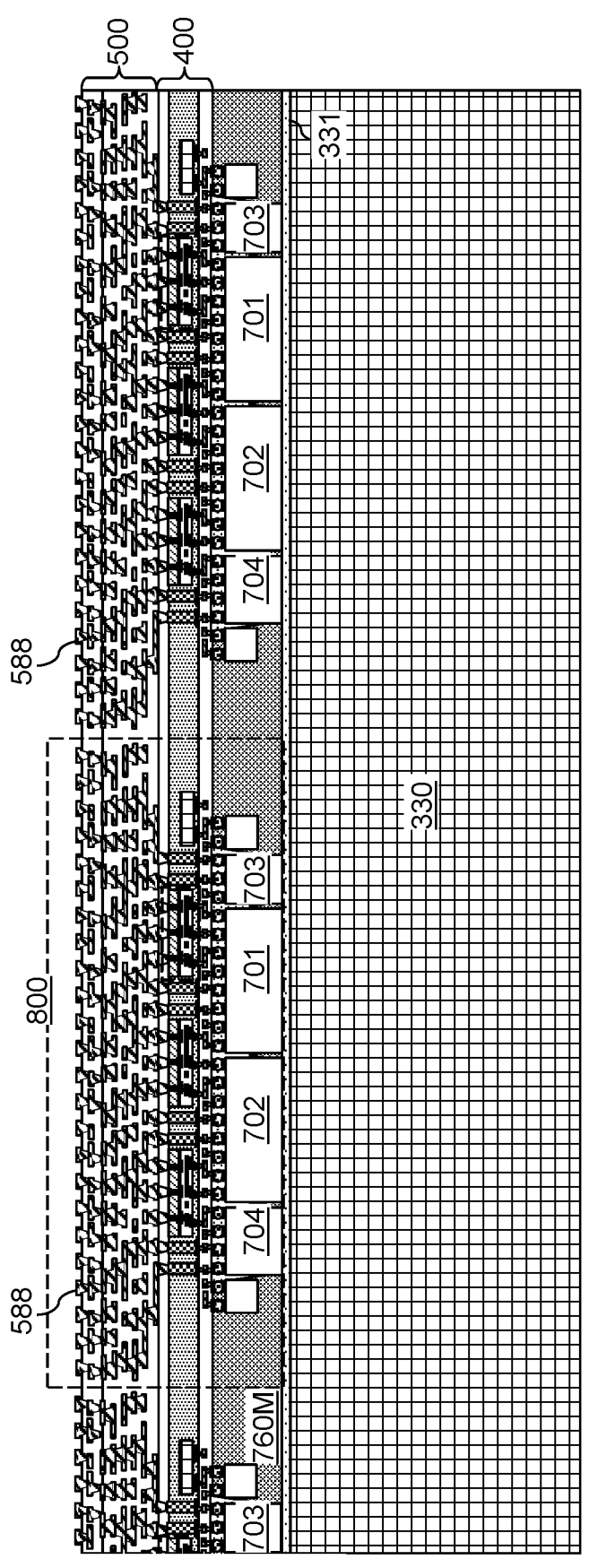
FIG. 12 is a vertical cross-sectional view of the exemplary structure after attaching a third carrier wafer and detaching the third carrier wafer according to an embodiment of the present disclosure.

Referring to FIG. 12, a third adhesive layer 331 may be applied on the die-level MC matrix 760M. The third adhesive layer 331 may comprise a light-to-heat conversion (LTHC) layer or a thermally decomposing adhesive material layer depending on the removal mechanism to be subsequently used. A third carrier wafer 330 may be attached to the die-level MC matrix 760M through the third adhesive layer 331. The third carrier wafer 330 may comprise any material that may be used for the first carrier wafer 310, and generally may have about the same thickness range as the first carrier wafer 310.

The third carrier wafer 330 may be detached from the a reconstituted wafer. In one embodiment, the third carrier wafer 330 includes an optically transparent material and the third adhesive layer 331 comprises a light-to-heat conversion material, irradiation through the third carrier wafer 330 may be used to detach the third carrier wafer 330. In embodiments in which the third adhesive layer 331 comprises a thermally decomposable adhesive material, an anneal process or a laser irradiation may be used to detach the third carrier wafer 330. A suitable clean process may be performed to remove residual portions of the third adhesive layer 331. The interposer bonding pads 588 of the composite interposers (400, 500) may be physically exposed.

Figure 13:
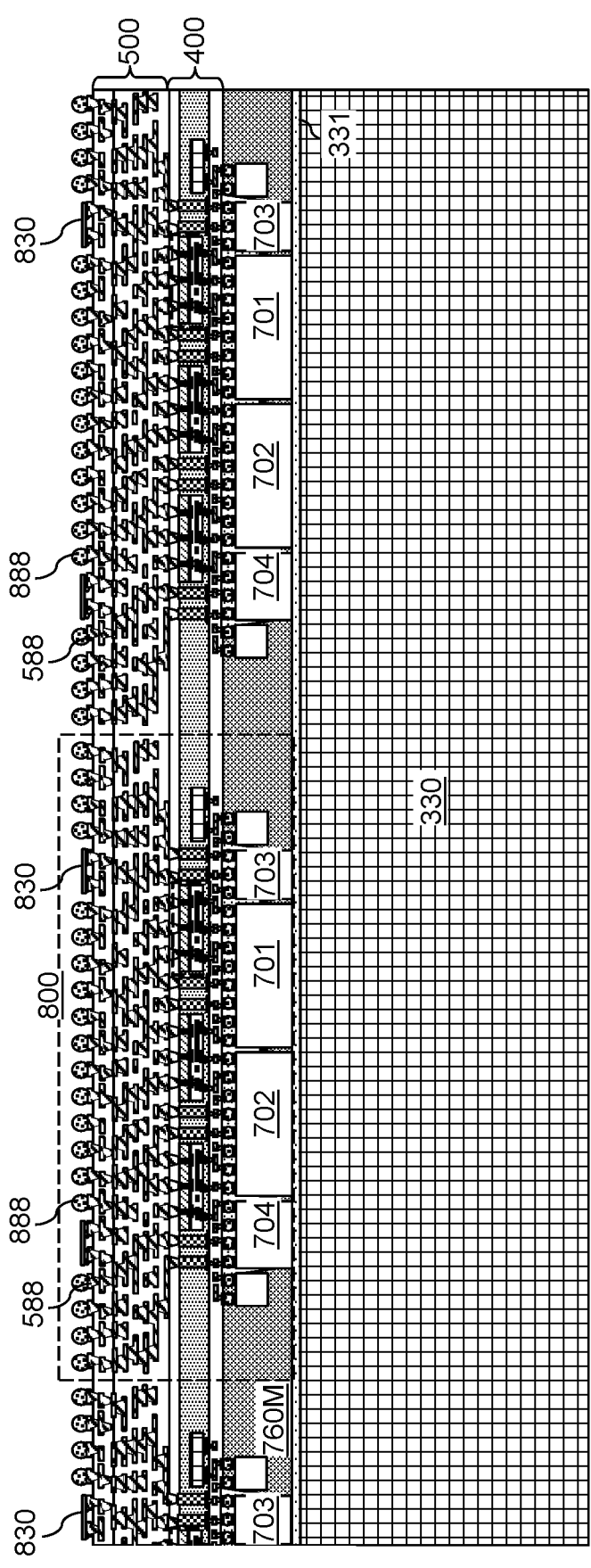
FIG. 13 is a vertical cross-sectional view of the exemplary structure after attaching solder material portions to interposer bonding pads and attaching integrated passive devices according to an embodiment of the present disclosure.
Figure 14A:
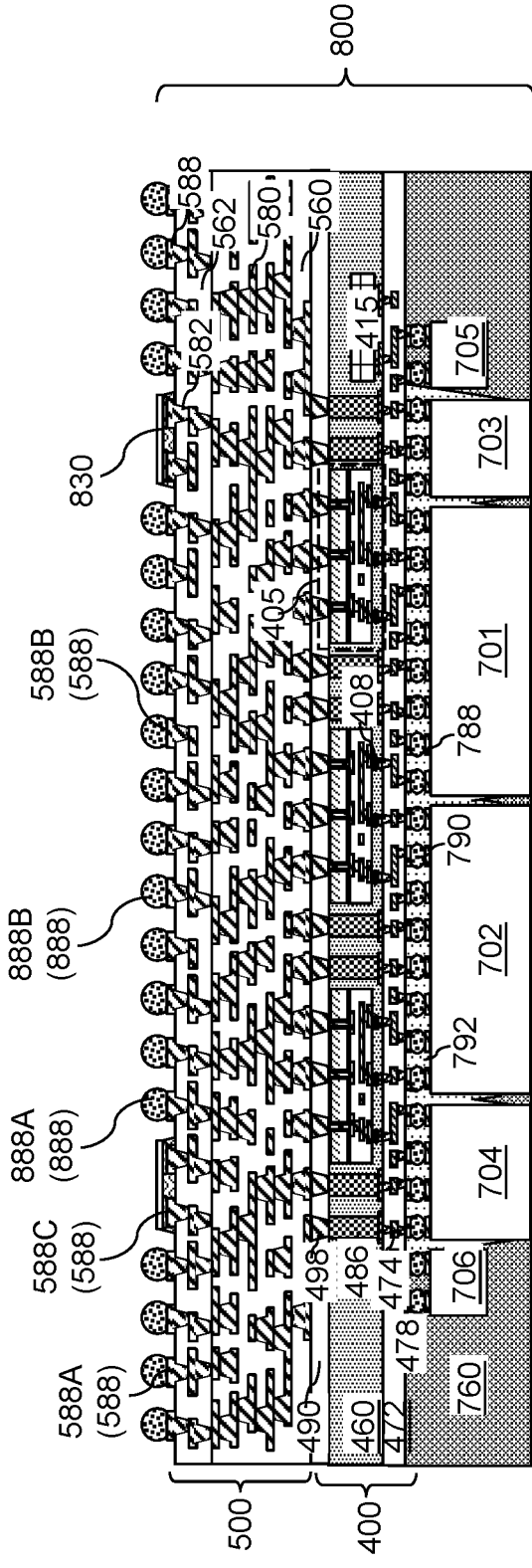
FIG. 14A is a vertical cross-sectional view of the exemplary structure after formation of a fan-out package that is obtained by detaching the third carrier wafer and dicing the reconstituted wafer according to an embodiment of the present disclosure.
Figure 14B:
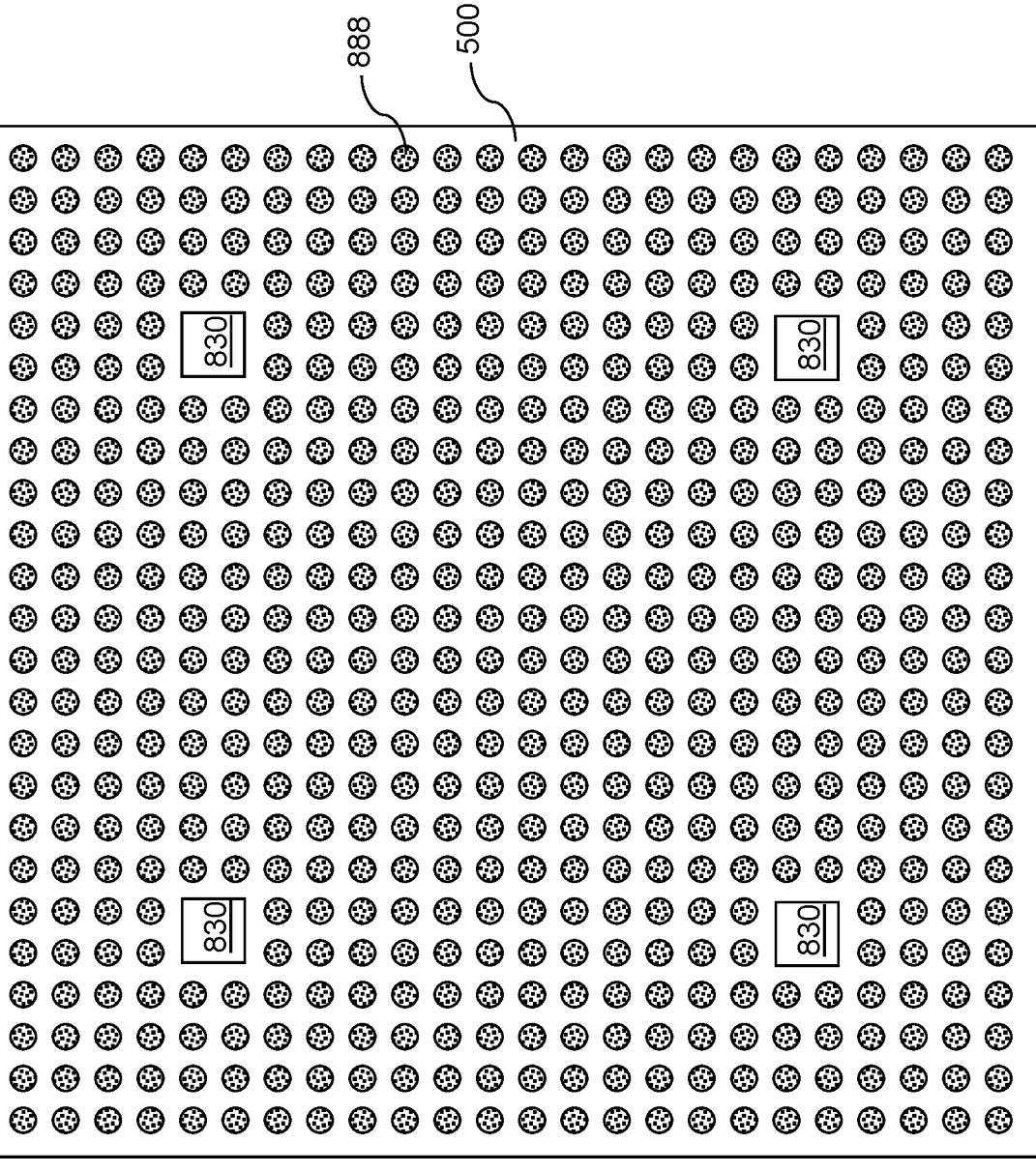
FIG. 14B is a top-down view of the fan-out package of FIG. 14A.

Referring to FIGS. 13, 14A, and 14B, integrated passive devices 830 may be optionally attached to a subset of the interposer bonding pads 588. FIG. 13 illustrates more than one unit area of the reconstituted wafer that includes a plurality of fan-out packages 800, and FIGS. 14A and 14B illustrate a unit area of the reconstituted wafer that includes a single fan-out package 800. The integrated passive devices 830 are also referred to as integrated passive components (IPCs) or embedded passive components (EPC). The integrated passive devices 830 may comprise passive electronic components such as resistors, capacitors, inductors (also referred to as coils or chokes), microstriplines, impedance matching elements, baluns, or any combinations thereof that are integrated in a same package or on a same substrate. Thin solder material portions may be used to bond the integrated passive devices 830 to the subset of the interposer bonding pads 588. In some embodiment, the subset of the interposer bonding pads 588 may be configured to provide bonding of the integrated passive devices 830 using thin solder material portions, for example, by having smaller sizes and/or by having different shapes.

Solder material portions may be applied to the interposer bonding pads 588 that are not used for bonding the integrated passive devices 830. The solder material portions 888 include first solder material portions 888A that are subsequently used to bond to substrate bonding pads provided on a packaging substrate to be subsequently used. The solder material portions 888 may further include second solder material portions 888B that may be subsequently used to attach at least one surface mount die to be subsequently used. A first subset of the interposer bonding pads 588 to which the first solder material portions 888A are attached is herein referred to as first interposer bonding pads 588A. A second subset of the interposer bonding pads 588 to which the second solder material portions 888B are attached is herein referred to as second interposer bonding pads 588B. A third subset of the interposer bonding pads 588 to the integrated passive devices 830 are attached are herein referred to as third interposer bonding pads 588C. In one embodiment, the first solder material portions 888A and the second solder material portions 888B may be applied to the first interposer bonding pads 588A and to the second interposer bonding pads 588B, respectively, in a same solder material application process. Alternatively, the second solder material portions 888B may have a different material composition that provides a higher reflow temperature than the first solder material portions 888A. In this embodiment, the second solder material portions 888B may be applied using a different process than the first solder material portions 888A.

Referring to FIGS. 14A and 14B, the third carrier wafer 330 may be detached from the a reconstituted wafer. In embodiments in which the third carrier wafer 330 includes an optically transparent material and the third adhesive layer 331 comprises a light-to-heat conversion material, irradiation through the third carrier wafer 330 may be used to detach the third carrier wafer 330. In embodiments in which the third adhesive layer 331 comprises a thermally decomposable adhesive material, an anneal process or a laser irradiation may be used to detach the third carrier wafer 330. A suitable clean process may be performed to remove residual portions of the third adhesive layer 331. A horizontal surface of the die-level MC matrix 760M may be physically exposed.

The reconstituted wafer includes a two-dimensional array of composite interposers (400, 500), and further includes a two-dimensional array of sets of at least one semiconductor die (701, 702, 703, 704, 705, 706) that are bonded to a respective composite interposer (400, 500). The reconstituted wafer may be diced along dicing channels by performing a dicing process. The dicing channels correspond to the boundaries between neighboring pairs of unit areas. Each diced unit from the reconstituted wafer comprises a fan-out package 800, to which the solder material portions 888 and the optional integrated passive devices 830 are attached. An underfill material portion 831 may be provided between each of the integrated passive devices 830 and the fan-out package 800. In other words, each diced portion of the assembly of the two-dimensional array of sets of semiconductor dies (701, 702, 703, 704, 705, 706), the two-dimensional array of die-side underfill material portions 792, the die-level MC matrix 760M, and the two-dimensional array of composite interposers (400, 500) comprises a fan-out package 800. Each diced portion of the die-level MC matrix 760M constitutes a molding compound die frame 760, i.e., an MC die frame 760.

Generally, an assembly comprising at least one semiconductor die (701, 702, 703, 704, 705, 706), an interposer (such as a composite interposer (400, 500)), first interposer bonding pads 588A, and second interposer bonding pads 588B may be provided. A fan-out package 800 constitutes such an assembly. In one embodiment, the second interposer bonding pads 588B may be provided at the center region of the interposer (400, 800), and thus, may be laterally surrounded by the first interposer bonding pads 588A. First solder material portions 888A and second solder material portions 888B may be attached to the first interposer bonding pads 588A and to the second interposer bonding pads 588B, respectively.

Figure 15A:
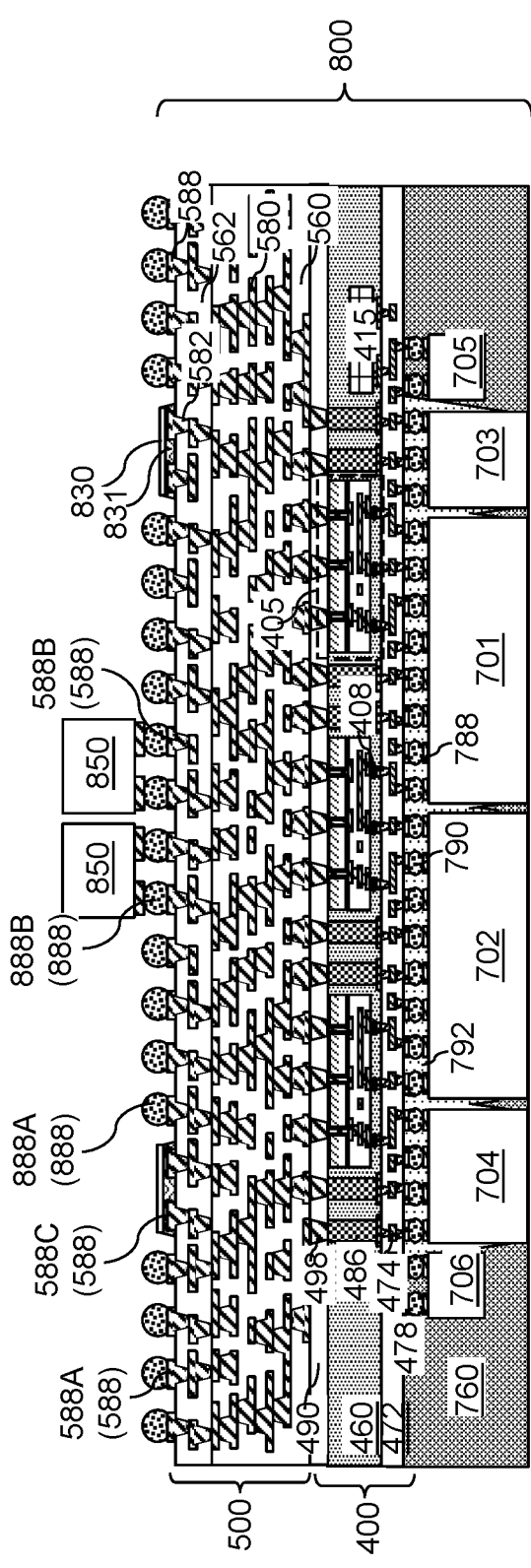
FIG. 15A is a vertical cross-sectional view of the exemplary structure after attaching surface mount dies to a subset of the solder material portions according to an embodiment of the present disclosure.
Figure 15B:
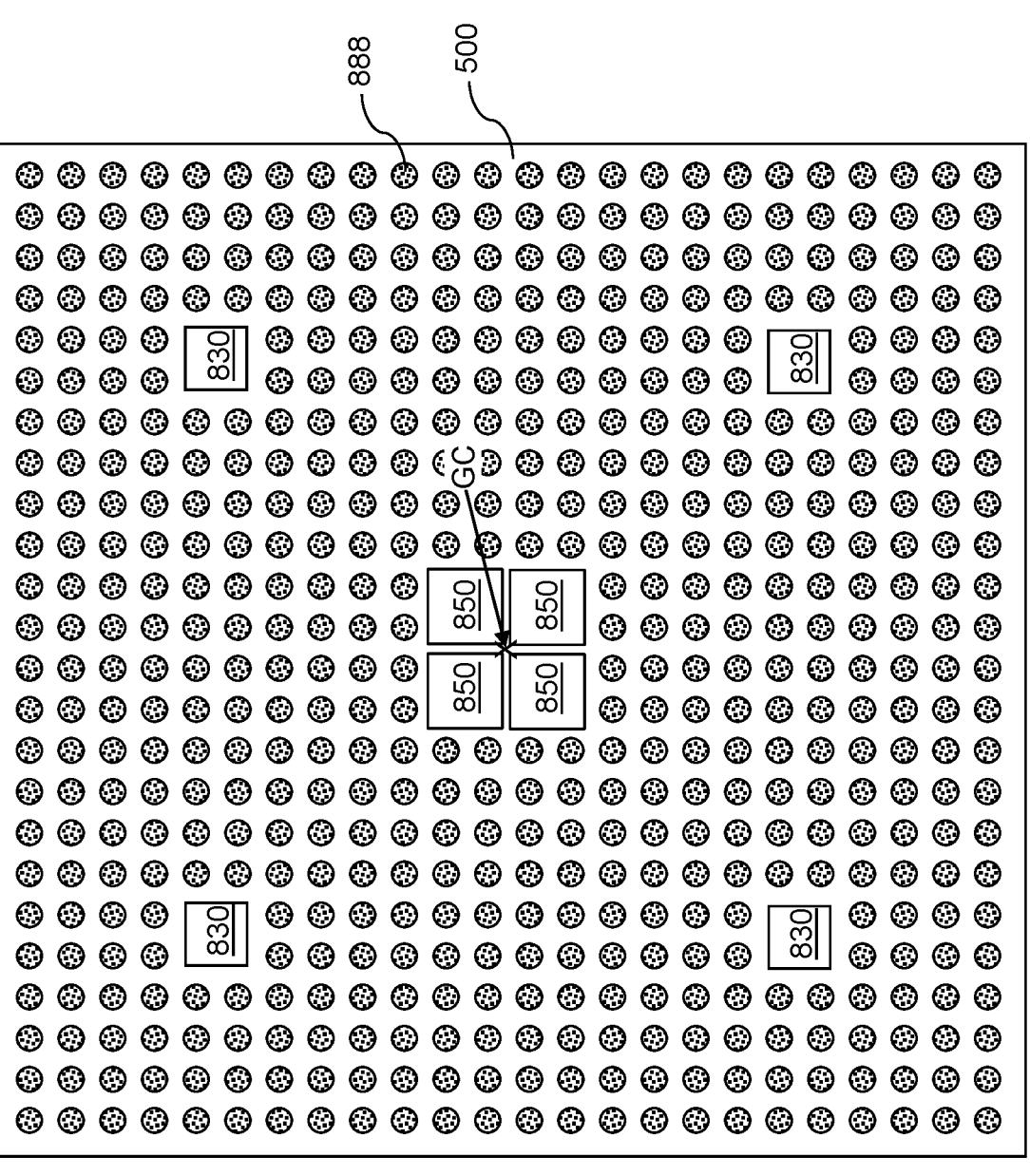
FIG. 15B is a top-down view of the exemplary structure of FIG. 15A.

Referring to FIGS. 15A and 15B, in one embodiment, surface mount dies 850 may be attached to the second interposer bonding pads 588B through the second solder material portions 888B. In this embodiment, the second solder material portions 888B may be reflowed without reflowing the first solder material portions 888A, for example, by locally heating the surface mount dies 850, for example, using a laser beam. In one embodiment, the second solder material portions 888B may have a higher reflow temperature than the first solder material portions 888A. In this embodiment, the second solder material portions 888B may, or may not, reflow during a subsequent reflow process used to attach a packaging substrate to the fan-out die 800 and reflows the first solder material portions 888A.

Alternatively, the surface mount dies 850 may be positioned over the second solder material portions 888B without performing a reflow process. In this embodiment, reflow of the second solder material portions 888B may be performed simultaneously with reflow of the first solder material portions 888A at a subsequent processing step after positioning a packaging substrate.

Generally, at least one surface mount die 850 may be attached to the second interposer bonding pads 588B using second solder material portions 888B. Generally, none, one, a plurality, and/or each, of the second interposer bonding pads 588B may be located in a center region of a horizontal surface of the composite interposer (400, 500) that faces a packaging substrate during a subsequent assembly process, which is herein referred to as a substrate-facing horizontal surface of the composite interposer (400, 500). The center region may include geometrical center GC of the substrate-facing horizontal surface of the composite interposer (400, 500). The location of the geometrical center GC of the substrate-facing horizontal surface may be defined as the arithmetic mean position of all the points within a horizontal surface bounded by the periphery of the substrate-facing horizontal surface as calculated in any Cartesian coordinate system. The second interposer bonding pads 588B are laterally surrounded by the first interposer bonding pads 588A. In one embodiment, at least one surface mount die 850 may be bonded to second interposer bonding pads 588B through second solder material portions 888B.

Figure 16A:
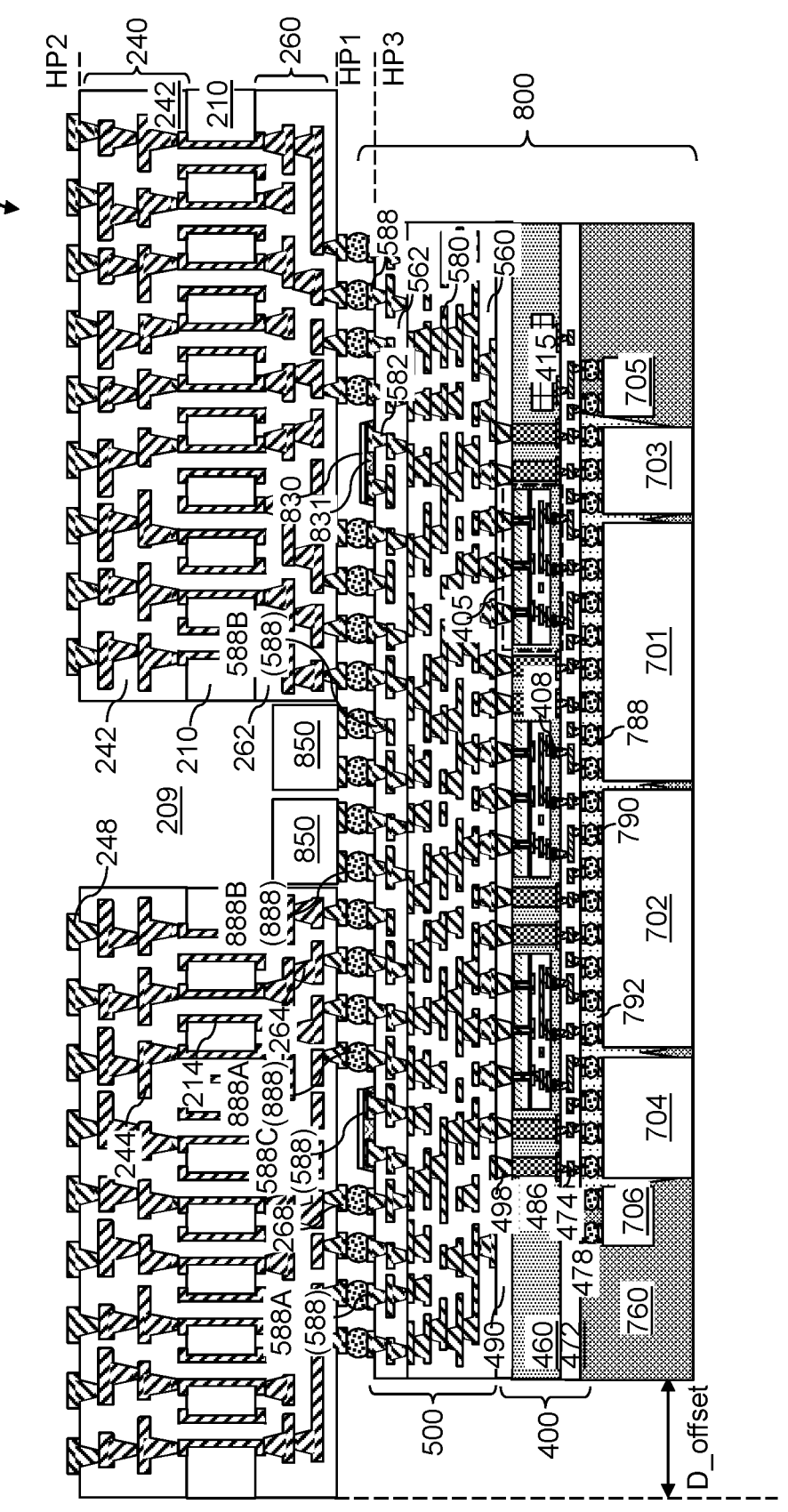
FIG. 16A is a vertical cross-sectional view of the exemplary structure after attaching a packaging substrate to the fan-out package according to an embodiment of the present disclosure.
Figure 16B:
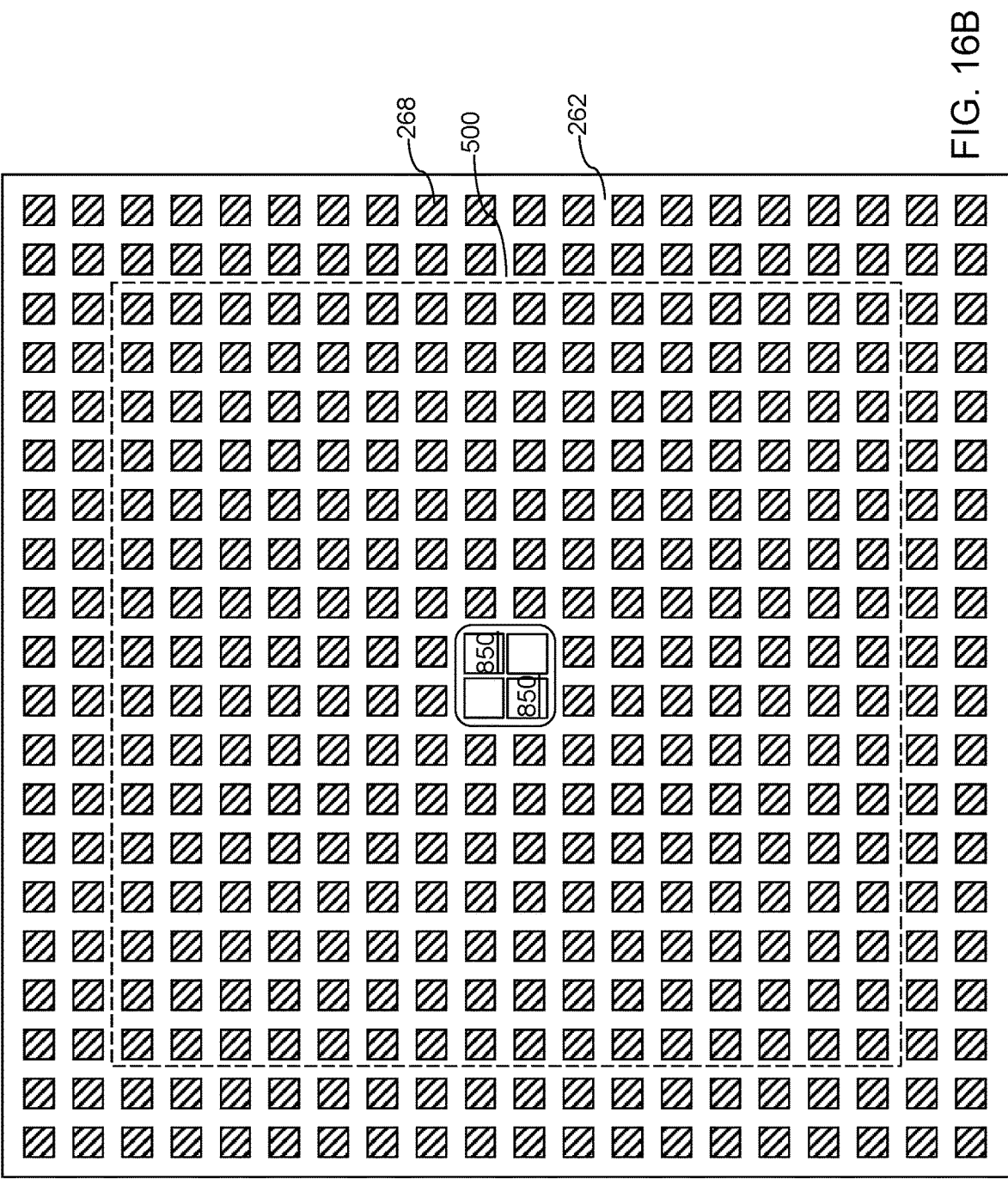
FIG. 16B is a top-down view of the exemplary structure of FIG. 16A.

Referring to FIGS. 16A and 16B, a packaging substrate 200 according to an embodiment of the present disclosure may be provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers, dielectric interlayers, and/or at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using a cored packaging substrate, it is understood that the scope of the present disclosure is not limited by any particular type of substrate package. For example, an SoIS may be used in lieu of a cored packaging substrate. In embodiments in which SoIS is used, the core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners (not illustrated) may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the chip-side surface laminar circuit 260 comprises chip-side wiring interconnects 264 that are connected to an array of substrate bonding pads 268. The array of substrate bonding pads 268 may be configured to allow bonding through C4 solder balls. The board-side surface laminar circuit 240 comprises board-side wiring interconnects 244 that are connected to an array of board-side bonding pads 248. The array of board-side bonding pads 248 is configured to allow bonding through solder joints having a greater dimension than the C4 solder balls. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

According to an aspect of the present disclosure, the packaging substrate 200 of the present disclosure includes an opening 209 therethrough. In one embodiment, the packaging substrate 200 comprises a first horizontal surface configured to face an assembly including a fan-out package 800. The first horizontal surface may be the substrate-facing horizontal surface described above. The packaging substrate 200 further comprises a second horizontal surface located on an opposite side of the first horizontal surface, and an opening 209 extending between the first horizontal surface and the second horizontal surface. The substrate bonding pads 268 of the packaging substrate 200 may be located on the first horizontal surface of the packaging substrate 200, and may have a mirror image pattern of the pattern of the first interposer bonding pads 588A. Thus, the substrate bonding pads 268 are not present within areas that overlap with the second interposer bonding pads 588A or with the integrated passive devices 830.

In one embodiment, the area of the opening 209 through the substrate 200 overlaps with the entirety of the areas of the second interposer bonding pads 588B in a plan view. In one embodiment, the packaging substrate 200 may be positioned such that the entirety of the second interposer bonding pads 588B is contained within the area of the opening 209 through the packaging substrate 200 in the plan view. As used herein, a plan view refers to a view along a vertical direction in which layout of components are shown without regard to direct visibility to an observer. In other words, a plan view is a see-through view along a vertical direction in which boundaries of all elements are represented.

The assembly including the fan-out package 800 may be attached to the packaging substrate 200 using the first solder material portions 888A. Specifically, each of the first solder material portions 888A may be bonded to a respective one of the substrate bonding pads 268 and to a respective one of the first interposer bonding pads 588A located on the interposer (400, 500). For example, the substrate bonding pads 268 may be disposed on the first solder material portions 888A such that the at least one source mount die 850 fits entirely within the area of the opening 209 through the packaging substrate 200.

A reflow process may be performed to reflow the first solder material portions 888A such that each first solder material portion 888A may be bonded to a respective one of the substrate bonding pads 268 and to a respective one of the first interposer bonding pads 588A. In some embodiments, the second solder material portions 888B may be reflowed concurrently with the reflow of the first solder material portions 888A. In some other embodiments, the second solder material portions 888B may have a higher reflow temperature, and is not reflowed during the reflow of the first solder material portions 888A.

In one embodiment, each of the at least one surface mount die 850 may be located entirely within the area of the opening 209 through the packaging substrate 200 in a plan view. In embodiments in which the at least one surface mount die 850 comprises a plurality of surface mount dies 850, the entirety of all areas of the plurality of surface mount dies 850 and the areas of the gaps among the plurality of surface mount dies 850 may be located within the area of the opening 209 in the plan view. In one embodiment, all sidewalls of the at least one surface mount die 850 may be laterally offset inward from a periphery of the opening 209 that adjoins the first horizontal surface of the packaging substrate 200.

In one embodiment, a horizontal surface (such as a distal horizontal surface that is distal from the fan-out package 800) of each surface mount die 850 may be located between a first horizontal plane HP1 including the first horizontal surface of the packaging substrate 200 and a second horizontal plane HP2 including the second horizontal surface (i.e., a backside horizontal surface) of the packaging substrate 200. The second horizontal surface HP2 of the packaging substrate 200 is vertically spaced from the first horizontal surface HP1 of the packaging substrate 200 by the thickness of the packaging substrate 200.

In one embodiment, a predominant fraction (such as more than 50%) of an entirety of the volume of each surface mount die 850 may be located between the first horizontal plane HP1 including the first horizontal surface of the packaging substrate 200 and the second horizontal plane HP2 including the second horizontal surface of the packaging substrate 200.

In one embodiment, the substrate bonding pads 268 may be located on a horizontal surface of the packaging substrate 200 located within the first horizontal plane HP1, and the packaging substrate 200 comprises a backside horizontal surface located within the second horizontal plane HP2. In one embodiment, the first interposer bonding pads 588A and the second interposer bonding pads 588B are located on a horizontal surface of the interposer (400, 500) located within a third horizontal plane HP3, and one, or each, of the at least one surface mount die 850 has a distal horizontal surface located between the first horizontal plane HP1 and the second horizontal plane HP2, and comprises bonding pads having bonding surfaces located between the first horizontal plane HP1 and the third horizontal plane HP3.

Generally, the first solder material portions 888A are bonded to a respective one of the substrate bonding pads 268 and to a respective one of the first interposer bonding pads 588A. At least one surface mount die 850 may be bonded to the second interposer bonding pads 588B through second solder material portions 888B. In this embodiment, the second interposer bonding pads 588B may be located on a same horizontal surface of the composite interposer (400, 500) as the first interposer bonding pads 588A. The entirety of the second interposer bonding pads 588B may be located within the area of the opening 209 through the packaging substrate 200 in the plan view.

Figure 17A:
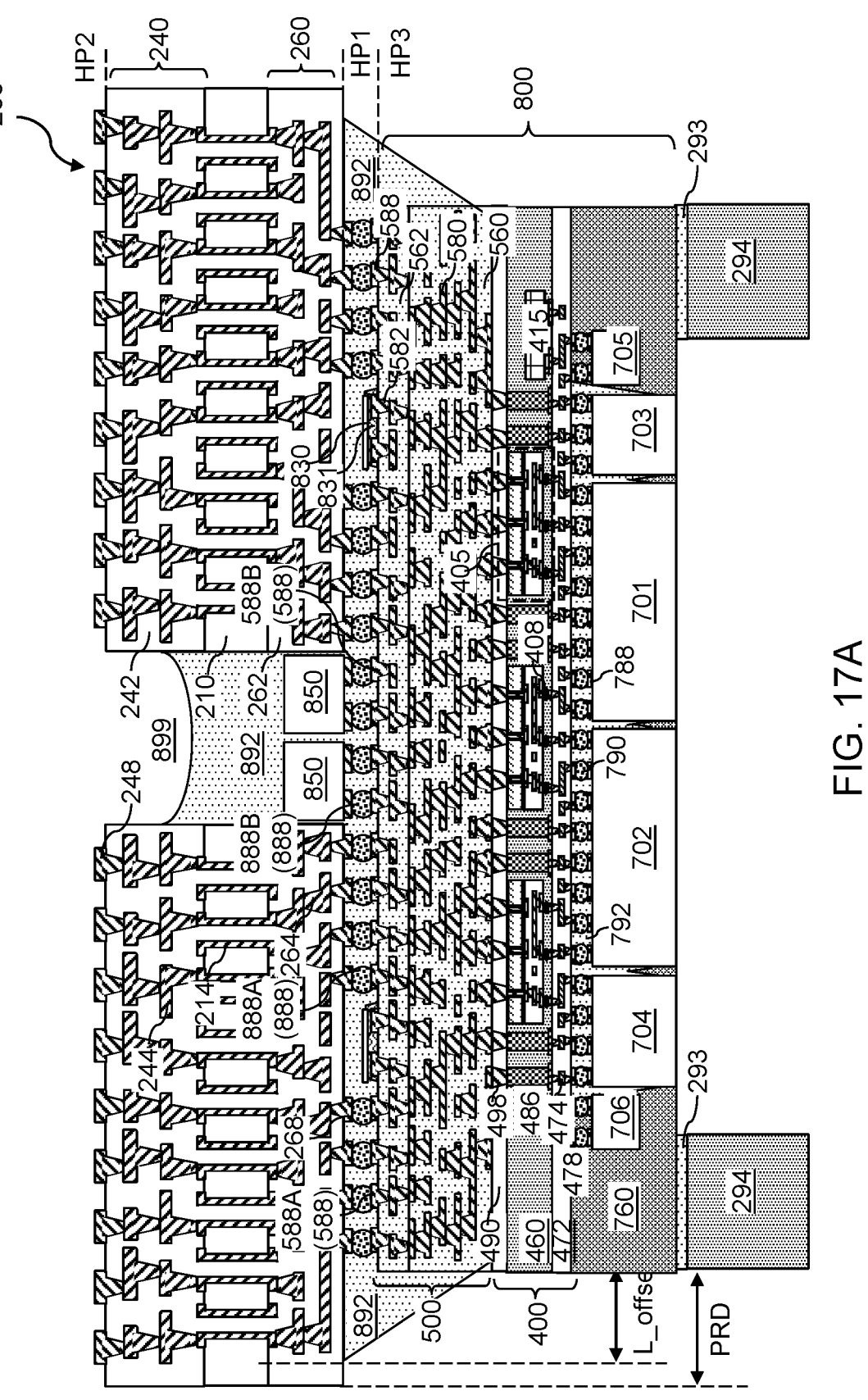
FIG. 17A is a vertical cross-sectional view of the exemplary structure after formation of an interposer-package underfill material portion and attaching a stiffener ring according to an embodiment of the present disclosure.
Figure 17B:
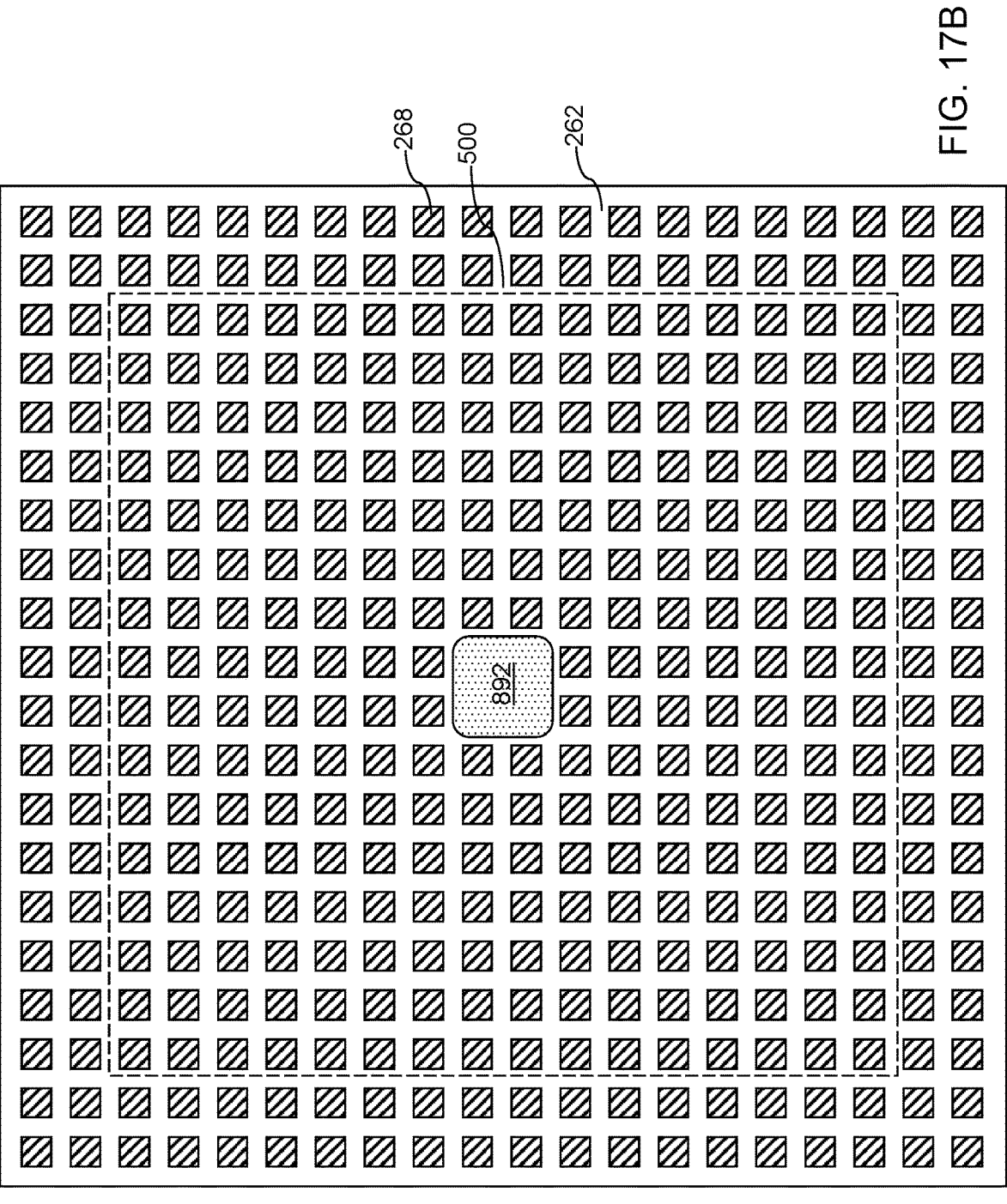
FIG. 17B is a top-down view of the exemplary structure of FIG. 17A.

Referring to FIGS. 17A and 17B, an underfill material may be applied into a gap between the composite interposer (400, 500) and the packaging substrate 200 through the opening 209 in the packaging substrate 200. The underfill material may comprise any underfill material known in the art. An additional underfill material having a same material composition or a different material composition may be applied from the four sides of the gap between the composite interposer (400, 500) and the packaging substrate 200. An underfill material portion may be formed around the first and second solder material portions 888 in the gap between the composite interposer (400, 500) and the packaging substrate 200. This underfill material portion is formed between the composite interposer (400, 500) and the packaging substrate 200, and thus, is herein referred to as an interposer-package underfill material portion 892, or as an IP underfill material portion 892.

In one embodiment, the entirety of the IP underfill material portion 892 may have the same material composition throughout. In such embodiments, the same underfill material compositions may be used for injection through the opening 209 in the packaging substrate 200 and for injection from the periphery of the gap between the composite interposer (400, 500) and the packaging substrate 200. In another embodiment, the center region of the IP underfill material portion 892 may have a first material composition, and a periphery region of the IP underfill material portion 892 that laterally surrounds and encapsulates the center region of the IP underfill material portion 892 has a second material composition that differs from the first material composition. In such embodiments, two different underfill material compositions are used for injection through the opening 209 in the packaging substrate 200 and for injection from the periphery of the gap between the composite interposer (400, 500) and the packaging substrate 200. In this embodiment, the differential in Young's modulus of the two different underfill materials may be advantageously used to reduce potential damage to the composite interposer (400, 500) under mechanical or thermal stress conditions.

Generally, use of two different underfill material injection schemes allow reduction of the lateral distance that the underfill material needs to travel to provide complete filling of the gap between the composite interposer (400, 500) and the packaging substrate 200. In prior art injection schemes in which an underfill material is injected only from the periphery of a gap between two opposing components, the minimum travel distance for an injected underfill material is the shortest distance between a geometrical center of the gap and the periphery, which corresponds to about one half of the length of shorter sides for a gap with a horizontal cross-sectional shape of a rectangle. In the illustrated structure, the minimum travel distance for an injected underfill material is about one half of the shortest distance between a periphery of the opening 209 through the packaging substrate 200 and the periphery of the gap between the composite interposer (400, 500) and the packaging substrate 200. Thus, the minimum travel distance for an injected underfill material during manufacturing of the structure of the present disclosure is less than a quarter of the length of the longer side for a gap with a horizonal cross-sectional shape of a rectangle. Since most gaps have a horizontal cross-sectional shape of a square, the reduction in the travel distance for an injected material may be 50% or more in embodiments that are used for injection of underfill materials from the opening 209 through the packaging substrate 200 and from the periphery of the gap between the composite interposer (400, 500) and the packaging substrate 200.

The IP underfill material portion 892 used in various embodiment structures may comprise a horizontally-extending portion located between the interposer (400, 500) and the packaging substrate 200. In one embodiment, the IP underfill material portion 892 laterally surrounds, and contacts, each of the first solder material portions 888A, the second solder material portions 888B, and the at least one surface mount die 850. Further, the IP underfill material portion 892 of the present disclosure may comprise a vertically-extending portion that protrude from the horizontally-extending portion into the opening 209 through the packaging substrate 200.

In one embodiment, at least one surface mount die 850 may be bonded to the second interposer bonding pads 588B through the second solder material portions 888B. In one embodiment, sidewalls of each surface mount die 850 may be in contact with the vertically-protruding portion of the underfill material portion 892. The vertically-extending portion of the IP dielectric material portion 892 may have a physically exposed surface that is laterally bounded by a set of at least one sidewall of the opening 209 through the packaging substrate 200. In one embodiment, a proximal portion of each sidewall of the opening 209 may be in direct contact with the vertically-protruding portion of the underfill material portion 892, and a distal portion of each sidewall of the opening 209 may be exposed to a cavity 899 that is laterally surrounded by a set of surfaces including each sidewall of the opening 209.

The reduction in the lateral travel distance for the underfill material to fill the gap between the interposer (400, 500) and the packaging substrate 200 reduces the pressure on the underfill material while the underfill material is applied from the periphery of the gap. Reduction in pressure during application of the underfill material at the periphery of the gap results in accumulation of less underfill material outside the area of the gap, i.e., around the periphery of the fan-out package 800. Thus, the area the first horizontal surface (i.e., the interposer-facing horizontal surface) of the packaging substrate 200 located within the first horizonal plane that contacts the IP underfill material portion 892. In other words, the lateral offset distance L_offset between the periphery of the contact area between the IP underfill material portion 892 and the packaging substrate 200 and the periphery of the fan-out package 800 in a plan view decreases through use of the dual injection scheme for formation of the IP underfill material portion 892. The reduction in the lateral offset distance L_offset provides the benefit of enabling reduction of the package retreat distance PRD, which is the lateral distance between the periphery of the packaging substrate 200 and the periphery of the fan-out package 800. Therefore, the dual underfill material injection scheme of the present disclosure provides reduction in the overall size of the assembly including the packaging substrate 200 and the fan-out die 800.

A stiffener ring 294 may be optionally attached to the physically exposed surface of the molding compound die frame 760 (i.e., an MC die frame 760) using, for example, an adhesive layer 293.

Figure 18A:
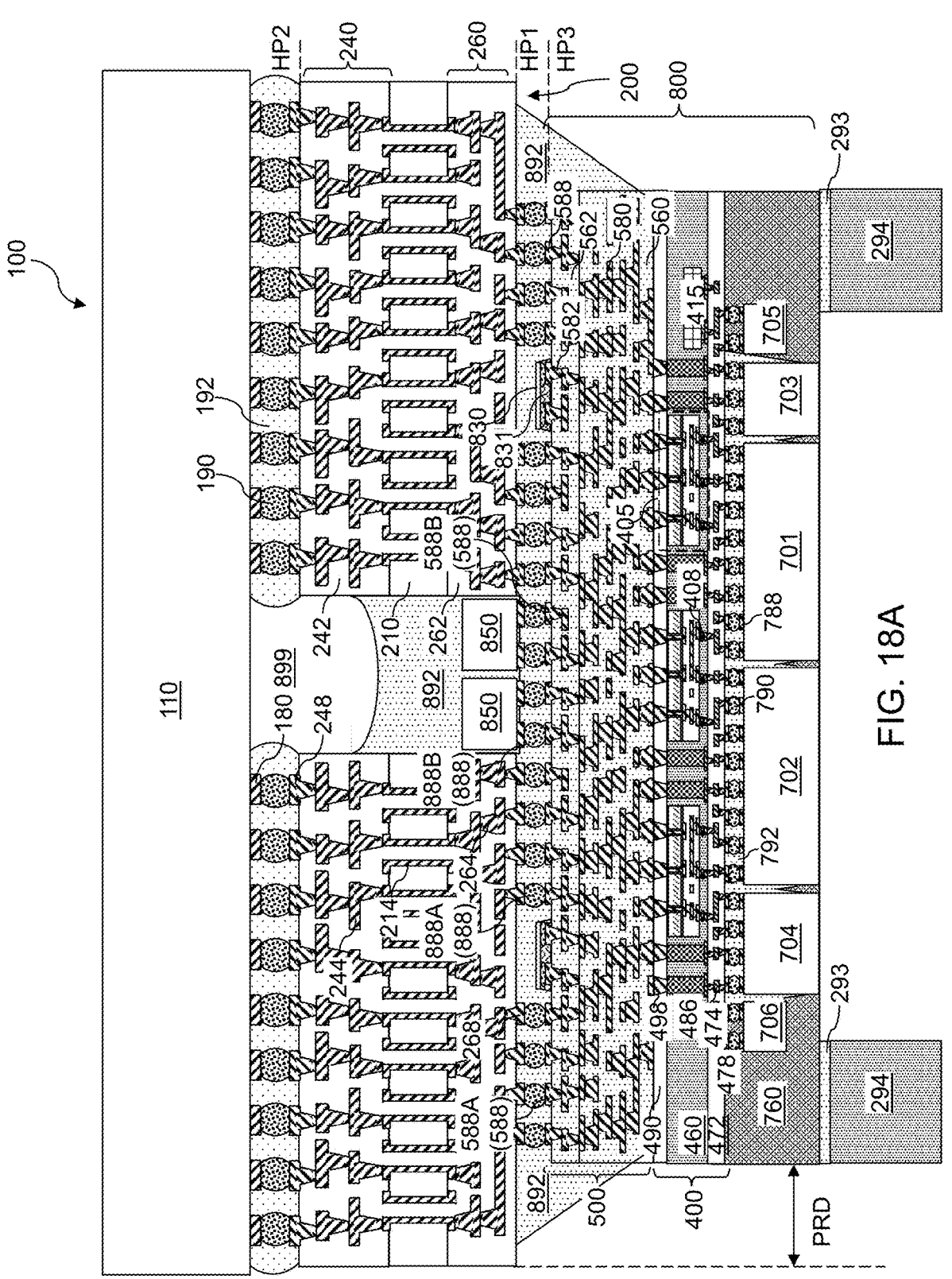
FIG. 18A is a vertical cross-sectional view of the exemplary structure after attaching the packaging substrate to a printed circuit board according to an embodiment of the present disclosure.

Referring to FIG. 18A, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An additional underfill material portion, which is herein referred to as a board-substrate underfill material portion 192 or a BS underfill material portion 192, may be formed around the solder joints 190 by applying and shaping an underfill material. The packaging substrate 200 is attached to the PCB 100 through the array of solder joints 190.

Generally, a printed circuit board 100 may be bonded to the packaging substrate 200 through an array of solder joints 190. An additional underfill material portion (such as the board-substrate underfill material portion 192) may be located between the printed circuit board 100 and the packaging substrate 200, and may laterally surround the solder joints 190. The cavity 899 may be vertically bounded by the printed circuit board 100 and may be laterally bounded, and encapsulated, by the additional underfill material portion, and thus, may become an encapsulated cavity 899. The encapsulated cavity 899 may be free of any solid phase material, and may be located within a volume that is laterally bounded by a set of surfaces including at least one sidewall of the opening 209 through the packaging substrate 200, and is laterally bounded by the additional underfill material portion (such as the board-substrate underfill material portion 192). The encapsulated cavity 899 may be vertically bounded by the underfill material portion 892 and the printed circuit board 100.

Figure 18B:
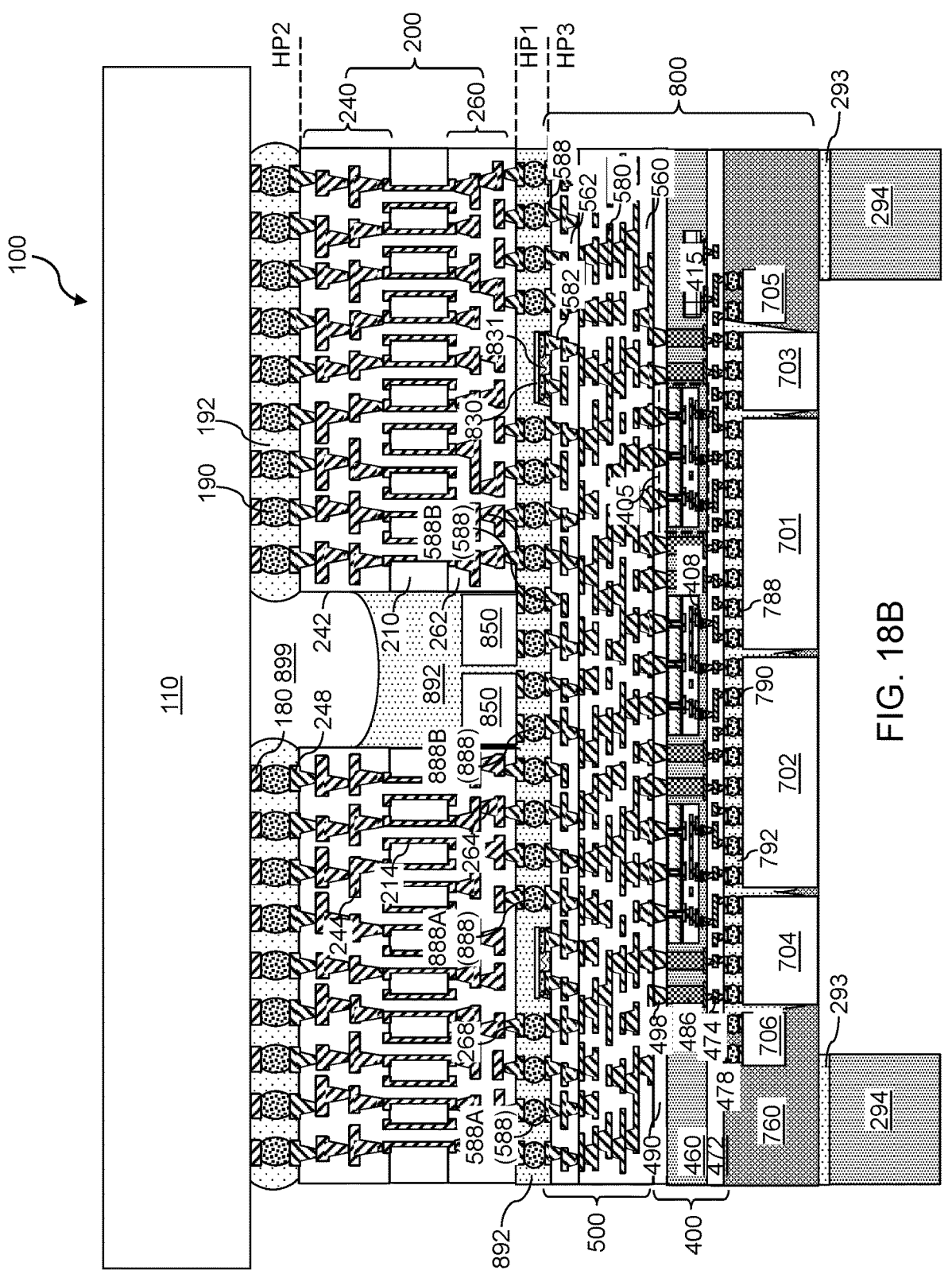
FIG. 18B is a vertical cross-sectional view of a first alternative configuration of the exemplary structure after attaching the packaging substrate to a printed circuit board according to an embodiment of the present disclosure.

Referring to FIG. 18B, a first alternative embodiment of the exemplary structure may be derived from the exemplary structure illustrated in FIG. 18A by employing a packaging substrate 200 having a different size. Specifically, the packaging substrate 200 used in the first embodiment of the exemplary structure may have the same horizontal cross-sectional shape and the same size as the fanout die 800. In one embodiment, the horizontal cross-sectional shape of the fan-out die 800 may coincide with the horizontal cross-sectional shape of the packaging substrate 200 in a plan view.

Figure 18C:
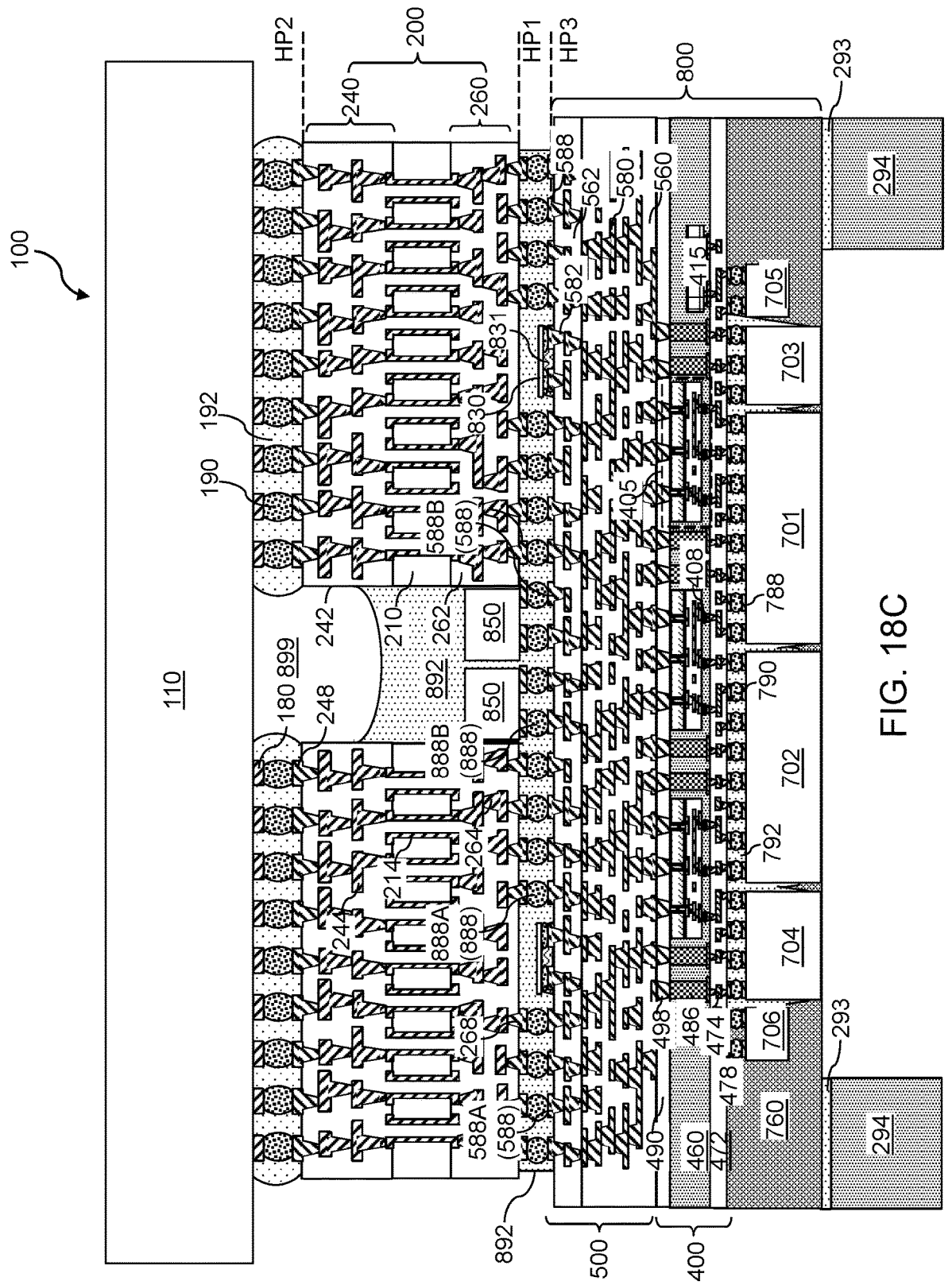
FIG. 18C is a vertical cross-sectional view of a second alternative configuration of the exemplary structure after attaching the packaging substrate to a printed circuit board according to an embodiment of the present disclosure.

Referring to FIG. 18C, a second alternative embodiment of the exemplary structure may be derived from the exemplary structure illustrated in FIG. 18A by using a packaging substrate 200 having a different size. Specifically, the packaging substrate 200 used in the second embodiment of the exemplary structure may have a greater size than the fan-out die 800. In one embodiment, the horizontal cross-sectional shape of the fan-out die 800 may be located entirely within, and may be laterally offset inward from, the horizontal cross-sectional shape of the packaging substrate 200 in a plan view.

FIG. 19 illustrates general steps for forming a semiconductor structure according to an embodiment of the present disclosure.

Referring to step 1910 and FIGS. 1A-15B, an assembly including at least one semiconductor die (701, 702, 703, 704, 705, 706) and an interposer (400, 500) may be provided.

Referring to step 1920 and FIGS. 16A and 16B, a packaging substrate 200 is provided. The packaging substrate 200 comprises substrate bonding pads 268. Further, the packaging substrate 200 comprises a first surface facing the assembly, a second surface located on an opposite side of the first surface, and an opening 209 extending between the first surface and the second surface. In one embodiment, the packaging substrate 200 comprises a first surface facing the assembly and having a first inner periphery and a first outer periphery, a second surface located on an opposite side of the first surface and having a second inner periphery and a second outer periphery, and at least one inner sidewall extending between the first inner periphery and the second inner periphery.

Referring to step 1930 and FIGS. 17A-18C, the assembly may be bonded to the packaging substrate 200 using first solder material portions 888A that are bonded to a respective one of the substrate bonding pads 268 and to a respective one of first interposer bonding pads 588A located on the interposer (400, 500).

Referring to all drawings and according to various embodiments of the present disclosure, a semiconductor structure is provided, which comprises: an assembly including at least one semiconductor die (701, 702, 703, 704, 705, 706) and an interposer (400, 500); a packaging substrate 200 comprising substrate bonding pads 268; and first solder material portions 888A bonded to a respective one of the substrate bonding pads 268 and to a respective one of first interposer bonding pads 588A located on the interposer (400, 500), wherein the packaging substrate 200 comprises a first horizontal surface facing the assembly, a second horizontal surface located on an opposite side of the first horizontal surface, and an opening 209 extending between the first horizontal surface and the second horizontal surface. In one embodiment, the packaging substrate comprises a first surface facing the assembly and having a first inner periphery and a first outer periphery, a second surface located on an opposite side of the first surface and having a second inner periphery and a second outer periphery, and at least one inner sidewall extending between the first inner periphery and the second inner periphery.

According to another aspect of the present disclosure, a semiconductor structure is provided, which comprises: an assembly comprising at least one semiconductor die (701, 702, 703, 704, 705, 706) and an interposer (400, 500) that comprises first interposer bonding pads 588A and second interposer bonding pads 588B; a packaging substrate 200 comprising substrate bonding pads 268 and including an opening 209 therethrough, wherein an area of the opening 209 overlaps with an area of the second interposer bonding pads 588B in a plan view; first solder material portions 888A bonded to a respective one of the substrate bonding pads 268 and to a respective one of the first interposer bonding pads 588A; and at least one surface mount die 850 bonded to the second interposer bonding pads 588B through second solder material portions 888B. In one embodiment, the packaging substrate 200 includes a first surface facing the assembly and having a first inner periphery and a first outer periphery, a second surface located on an opposite side of the first surface and having a second inner periphery and a second outer periphery, and at least one inner sidewall extending between the first inner periphery and the second inner periphery, wherein an area enclosed by the first inner periphery overlaps with an area of the second interposer bonding pads 588B in a plan view.

The various embodiments of the present disclosure may be used to facilitate formation of an underfill material portion in a gap between a package (which may, or many not, be a fan-out package 800) including at least one semiconductor die (701, 702, 703, 704, 705, 706) and a packaging substrate 200 including an opening 209 there-through. By reducing the lateral distance that the underfill material needs to travel to fill the volume of the gap, the pressure applied to the underfill material at the periphery of the gap may be reduced, and less underfill material accu- mulates around the gap, thereby reducing the lateral extent of the underfill material and enabling reduction of the package retreat distance PRD.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
an assembly including at least one semiconductor die and an interposer;
a packaging substrate comprising substrate bonding pads; and
first solder material portions bonded to a respective one of the substrate bonding pads and to a respective one of first interposer bonding pads located on the interposer, wherein the packaging substrate comprises a first surface facing the assembly and having a first inner periphery and a first outer periphery, a second surface located on an opposite side of the first surface and having a second inner periphery and a second outer periphery, and at least one inner sidewall extending between the first inner periphery and the second inner periphery, and wherein the interposer is interposed between the at least one semiconductor die and the packaging substrate.

2. The semiconductor structure of claim 1, further com- prising a surface mount die that is bonded to second inter-poser bonding pads located on the interposer through second solder material portions.

3. The semiconductor structure of claim 2, wherein the surface mount die is located entirely within an area of the first inner periphery in a plan view.

4. The semiconductor structure of claim 3, wherein a horizontal surface of the surface mount die is located between a first horizontal plane including the first surface and a second horizontal plane including the second surface.

5. The semiconductor structure of claim 3, wherein a predominant fraction of an entirety of a volume of the surface mount die is located between a first horizontal plane including the first surface and a second horizontal plane including the second surface.

6. The semiconductor structure of claim 1, further com- prising an underfill material portion laterally surrounding each of the first solder material portions and comprising a horizontally-extending portion located between the inter-poser and the packaging substrate.

7. The semiconductor structure of claim 6, wherein the underfill material portion comprises a vertically-protruding portion that protrudes from the horizontally-extending por-tion and into a volume laterally surrounded by the at least one inner sidewall.

8. The semiconductor structure of claim 7, further com- prising a surface mount die that is bonded to second interposer bonding pads located on the interposer through second solder material portions, wherein sidewalls of the surface mount die is in contact with the vertically-protruding portion of the underfill material portion.

9. The semiconductor structure of claim 7, wherein:
a proximal portion of each of the at least one inner sidewall is in direct contact with the vertically-protrud-ing portion of the underfill material portion; and
a distal portion of each of the at least one inner sidewall is exposed to a cavity.

10. The semiconductor structure of claim 6, further com-prising:
a printed circuit board that is bonded to the packaging substrate through an array of solder joints;
an additional underfill material portion located between the printed circuit board and the packaging substrate and laterally surrounding the solder joints; and
an encapsulated cavity that is free of any solid phase material and is located within a volume that is laterally bounded by at least one inner sidewall through the packaging substrate and the additional underfill mate-rial portion, and is vertically bounded by the underfill material portion and the printed circuit board.

11. A semiconductor structure comprising:
an assembly comprising at least one semiconductor die and an interposer that comprises first interposer bond-ing pads and second interposer bonding pads;
a packaging substrate comprising substrate bonding pads and including a first surface facing the assembly and having a first inner periphery and a first outer periphery, a second surface located on an opposite side of the first surface and having a second inner periphery and a second outer periphery, and at least one inner sidewall extending between the first inner periphery and the second inner periphery, wherein an area enclosed by the first inner periphery overlaps with an area of the second interposer bonding pads in a plan view;
first solder material portions bonded to a respective one of the substrate bonding pads and to a respective one of the first interposer bonding pads; and
at least one surface mount die bonded to the second interposer bonding pads through second solder material portions,
wherein the interposer is interposed between the at least one semiconductor die and the packaging substrate.

12. The semiconductor structure of claim 11, wherein the second interposer bonding pads are laterally surrounded by the first interposer bonding pads.

13. The semiconductor structure of claim 11, wherein the at least one surface mount die is located entirely within the area of the first inner periphery in the plan view.

14. The semiconductor structure of claim 11, wherein:
the substrate bonding pads are located on a horizontal surface of the packaging substrate located within a first horizontal plane;
the packaging substrate comprises a backside horizontal surface located within a second horizontal plane;
the first interposer bonding pads and the second interposer bonding pads are located on a horizontal surface of the interposer located within a third horizontal plane; and
one of the at least one surface mount die has a distal horizontal surface located between the first horizontal plane and the second horizontal plane and comprises bonding pads having bonding surfaces located between the first horizontal plane and the third horizontal plane.

15. The semiconductor structure of claim 11, further comprising an underfill material portion laterally surrounding each of the first solder material portions, the second solder material portions, and the at least one surface mount die, and comprising a vertically-extending portion that protrude into a volume that is laterally enclosed by the at least one inner sidewall through the packaging substrate.

16. A semiconductor structure comprising:

an assembly including at least one semiconductor die and an interposer;

a packaging substrate comprising substrate bonding pads, a first surface facing the assembly, a second surface located on an opposite side of the first surface, and an opening vertically extending between the first surface and the second surface;

first solder material portions bonded to a respective one of the substrate bonding pads and to a respective one of first interposer bonding pads located on the interposer; and an underfill material portion comprising a horizontally-extending portion that laterally surrounds the first solder material portions and a vertically-extending portion that is located within the opening in the packaging substrate, wherein the interposer is interposed between the at least one semiconductor die and the packaging substrate.

17. The semiconductor structure of claim 16, further comprising a surface mount die that is bonded to second interposer bonding pads located on the interposer through second solder material portions.

18. The semiconductor structure of claim 17, wherein the surface mount die is located entirely within an area of the opening in the packaging substrate in a plan view.

19. The semiconductor structure of claim 17, wherein sidewalls of the surface mount die is in contact with the vertically-protruding portion of the underfill material portion.

20. The semiconductor structure of claim 16, further comprising a cavity that is located in a distal portion of the opening in the packaging substrate that is more distal from the assembly than the vertically-extending portion of the underfill material portion is from the assembly, and is free of any solid phase material.

* * * * *